(12) United States Patent
Carlson et al.

(10) Patent No.: US 10,453,976 B2
(45) Date of Patent: Oct. 22, 2019

(54) SYSTEMS AND METHODS FOR FORMING FOIL CONTACT REAR EMITTER SOLAR CELLS WITH CARRIER SELECTIVE CONTACTS

(71) Applicant: Natcore Technology, Inc., Rochester, NY (US)

(72) Inventors: David E. Carlson, Williamsburg, VA (US); David Howard Levy, Rochester, NY (US)

(73) Assignee: NATCORE TECHNOLOGY, INC., Rochester, NY (US)

( * ) Notice: Subject to any disclaimer, the term of this patent is extended or adjusted under 35 U.S.C. 154(b) by 0 days.

(21) Appl. No.: 16/012,188

(22) Filed: Jun. 19, 2018

(65) Prior Publication Data
US 2018/0366597 A1 Dec. 20, 2018

Related U.S. Application Data

(60) Provisional application No. 62/522,223, filed on Jun. 20, 2017.

(51) Int. Cl.
*H01L 31/00* (2006.01)
*H01L 31/0224* (2006.01)
(Continued)

(52) U.S. Cl.
CPC ........ *H01L 31/022441* (2013.01); *H01L 31/02167* (2013.01); *H01L 31/0516* (2013.01);
(Continued)

(58) Field of Classification Search
CPC .......... H01L 31/1868; H01L 31/02366; H01L 31/022441
See application file for complete search history.

(56) References Cited

U.S. PATENT DOCUMENTS 8,877,367 B2 * 11/2014 Holme ............... H01G 9/02
429/144
9,502,601 B1 * 11/2016 Smith ............ H01L 31/02167
(Continued)

FOREIGN PATENT DOCUMENTS

WO 2012135395 10/2012

OTHER PUBLICATIONS

Nakamura et al.; Development of Heterojunction Back Contact Si Solar cells; IEEE Journal of Photovoltaics, vol. 4, No. 6. Nov. 2014.

*Primary Examiner* — Nicholas J Tobergte
(74) *Attorney, Agent, or Firm* — Winstead PC

(57) ABSTRACT

A solar cell structure may provide a front surface that may include a front passivation layer and front anti-reflective layer. The solar cell structure may provide both contacts on a rear surface. In some cases, the rear surface may optionally provide passivation, doped, and/or transparent conductive oxide layers. The rear surface also provides a multilayer foil assembly (MFA). The MFA provides a first metal foil in electrical communication with doped regions of the rear surface of the substrate, such as base or emitter regions. The MFA may also provide a second metal foil that is spaced apart from the first metal foil by a dielectric layer. The metal foils and dielectric layers may include openings through the entirety of these layers, and these openings may be utilized to form contacts electrically coupled to the second metal foil, which is electrically isolated from the first metal foil. Contacts to the solar cell may be carrier selective contacts, formed by deposition, laser transfer, and/or chemical transformation processes.

20 Claims, 16 Drawing Sheets

(51) Int. Cl.
  *H01L 31/0216* (2014.01)
  *H01L 31/18* (2006.01)
  *H01L 31/0747* (2012.01)
  *H01L 31/05* (2014.01)
  *H01L 31/068* (2012.01)
  *H01L 31/0236* (2006.01)

(52) U.S. Cl.
  CPC ...... *H01L 31/0682* (2013.01); *H01L 31/0747* (2013.01); *H01L 31/1804* (2013.01); *H01L 31/1864* (2013.01); *H01L 31/1868* (2013.01); *H01L 31/02366* (2013.01)

(56) References Cited

U.S. PATENT DOCUMENTS

| | | | |
|---|---|---|---|
| 9,570,638 B2* | 2/2017 | Carlson | B23K 26/0876 |
| 9,634,166 B2* | 4/2017 | Eickelmann | H01L 31/0465 |
| 9,634,178 B1* | 4/2017 | Kim | H01L 31/022441 |
| 9,837,561 B2* | 12/2017 | Levy | H01L 31/022441 |
| 9,859,451 B2* | 1/2018 | Eickelmann | H01L 31/0465 |
| 10,032,942 B2* | 7/2018 | Kim | H01L 31/022441 |
| 10,224,442 B2* | 3/2019 | Smith | H01L 31/02167 |
| 10,290,750 B2* | 5/2019 | Carlson | H01L 31/022441 |
| 2009/0027371 A1* | 1/2009 | Lin | G06F 3/0412 |
| | | | 345/207 |
| 2013/0171767 A1* | 7/2013 | Moslehi | H01L 21/26586 |
| | | | 438/89 |
| 2014/0147944 A1* | 5/2014 | Kommera | H01L 22/14 |
| | | | 438/17 |
| 2015/0129031 A1* | 5/2015 | Moslehi | H01L 31/022441 |
| | | | 136/256 |
| 2017/0062633 A1 | 3/2017 | Carlson et al. | |
| 2017/0077336 A1* | 3/2017 | Smith | H01L 31/0547 |

\* cited by examiner

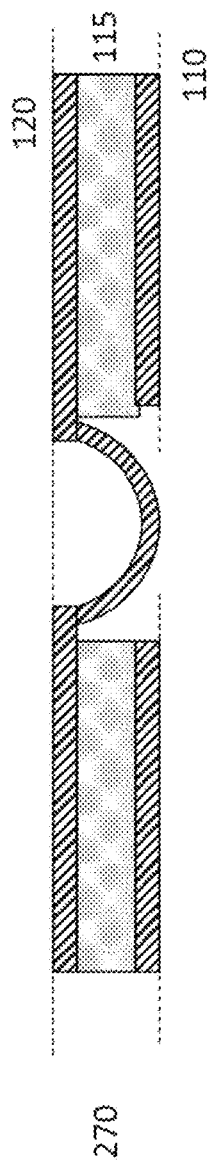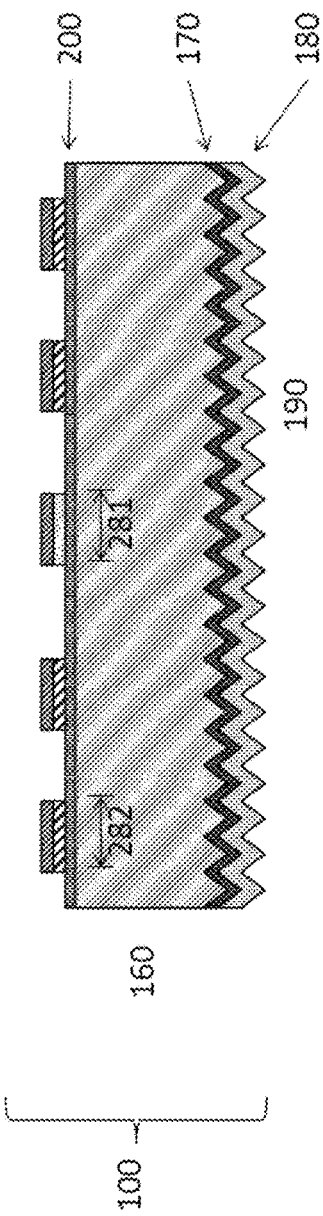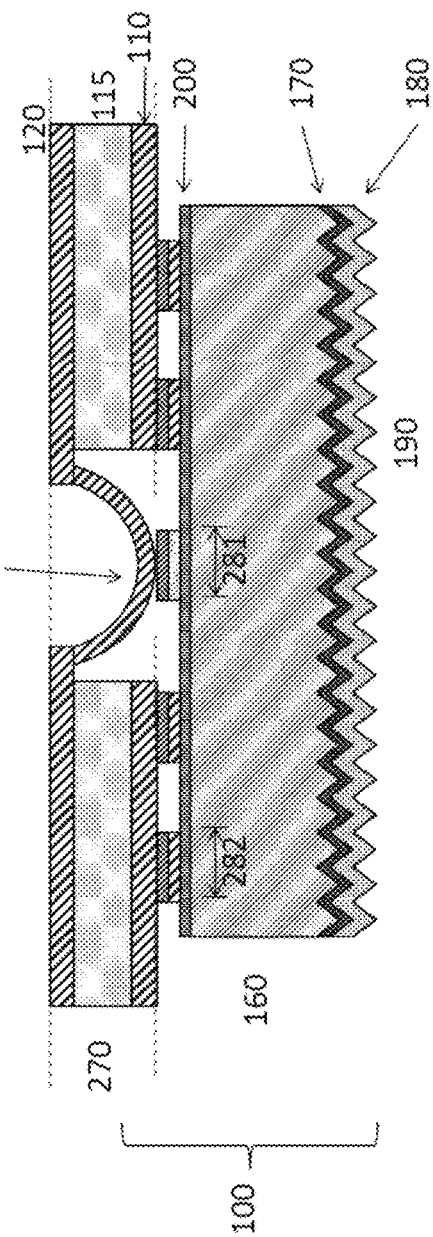
FIG. 8C
FIG. 8D

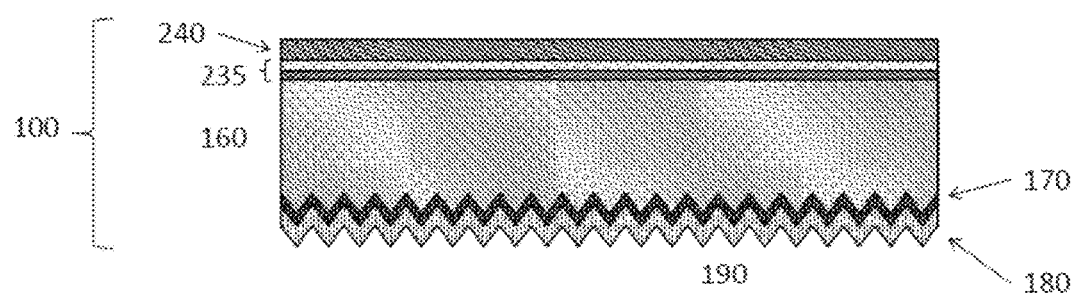
FIG. 12A
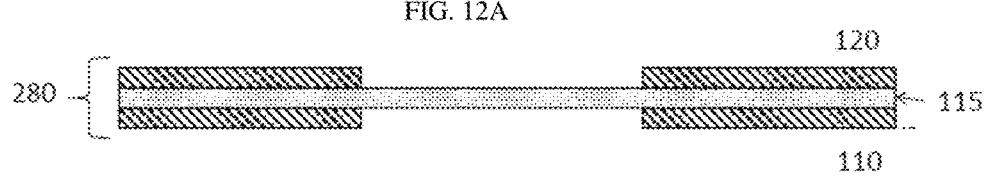
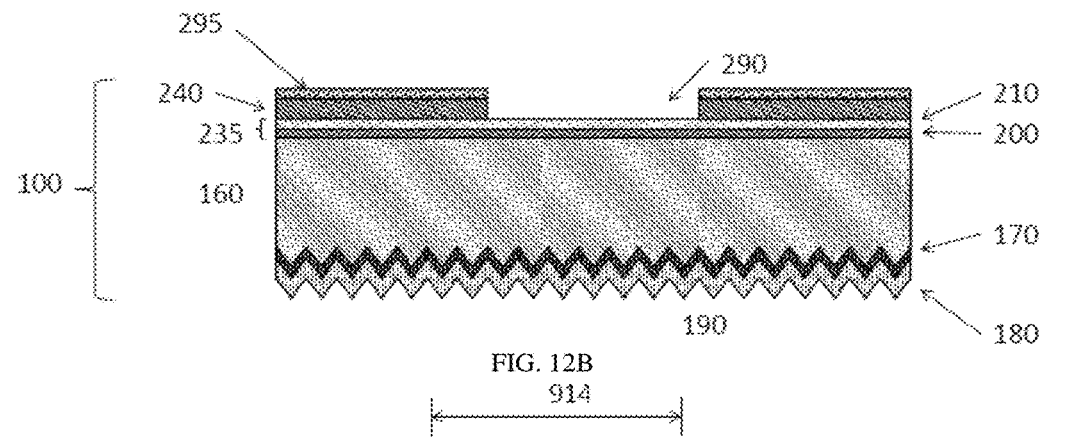
FIG. 12B
FIG. 12C

SYSTEMS AND METHODS FOR FORMING FOIL CONTACT REAR EMITTER SOLAR CELLS WITH CARRIER SELECTIVE CONTACTS

RELATED APPLICATIONS

This application claims the benefit of U.S. Provisional Patent Application No. 62/522,223 filed on Jun. 20, 2017, which is incorporated herein by reference.

FIELD OF THE INVENTION

This invention relates to all back contact solar cells. More particularly, to systems and methods for fabricating back contact solar cells with multilayer metallization.

BACKGROUND OF INVENTION

A solar cell geometry referred to as an interdigitated back contact (IBC) cell comprises a semiconductor wafer and alternating lines (interdigitated stripes) of metal coinciding with regions with p-type and n-type doping, respectively. This cell geometry has the advantage of eliminating shading losses altogether by putting both contacts on the rear side of the wafer that is not illuminated. Further, interconnection in a module is facilitated with both contacts on the rear surface of the wafer.

Presently, silicon solar cells with the highest efficiency are those based on the IBC structure, with cells exhibiting efficiencies as high as 26.4%. While the processing of these high efficiency IBC solar cells was not discussed in any detail, the manufacturing costs are likely to be relatively high since the known processing techniques that could be applied in each appear to be somewhat complicated with various masking and vacuum processing steps required.

Many solar cell structures, including the IBC structure, rely upon thin fingers of metal to collect current. In the case of the IBC cell, these thin fingers are interdigitated on the back of the cell, and often resulting from a single metal deposition that has been patterned to reveal the finger structure. The area of each contact is less than ½ of the total cell area because they share the same layer and there is need for an insulation region (e.g. isolation gap) between the fingers. Combining this with the fact that current must travel along the narrow fingers, very high conductivity layers are required for the fingers. The solar industry resorts almost exclusively to silver, an expensive metal, to address the need for high conductivity, thus low resistance. Additionally, larger cell sizes exacerbate issues associated with resistance in the metal contacts of the solar cell.

There have been attempts to provide improved metallization for solar cells. A multilayer metallization applies each contact metal (base, emitter) as a contiguous sheet of metal over the entire cell with vias in the bottom contact metal sheet allowing the top sheet to make localized base contacts, such vias made with a photolithographic process. However the photolithographic process is expensive and not suited to solar cell manufacturing. Another method applies relatively thick metals in cost effective ways, but does not address approaches needed for make useful back contact cells. Therefore, there is firstly a need for effective and inexpensive methods to provide metallization for back contact cells.

Furthermore, in order to allow the basic operation of a solar cell and extract electric current, regions of the solar cell may behave so that they favor the existence of one charge carrier (holes or electrons) over the other. Conventionally, these regions may be formed by doping the silicon with dopant atoms that convert the silicon to a state where a surplus of electrons (n-type) or holes (p-type) is favored. Doping, however, usually requires high temperature processes since the dopant needs to be incorporated in the silicon above its melting point or at a sufficiently high temperature that it can diffuse into solid silicon.

An alternative approach is to contact the silicon with materials or systems that energetically favor the existence or transport of a particular charge carrier. These materials or systems may also need to sufficiently passivate the surface of the silicon to minimize defects at or near the surface and avoid fermi level pinning, reducing the likelihood of recombination or energetic barriers at the contact. Such materials or systems may be referred to as heterocontacts, passivating contacts, or carrier selective contacts. High temperature doping, whether achieved with thermal diffusion, thermal annealing, or laser doping, introduces defects in the solar cell that limit performance. Carrier selective contacts may be applied at low temperature and cause minimum damage to the substrate, and thus are capable of higher performance.

In order to produce very high performance solar cells at low cost, there is a need to provide multilevel metallization systems in conjunction with carrier selective contacts. There is also a need to provide carrier selective contacts in a low cost process. In U.S. patent application Ser. No. 15/068,900 filed on Mar. 14, 2016 (U.S. Pub. No. 2017/0062633), which is fully incorporated by reference herein, multilayer foil metallization with laser processed back contacts were discussed. Further improvements to systems and methods for forming rear emitters and/or rear base contacts using carrier selective contacts with multilayer foil metallization are discussed herein.

SUMMARY OF THE INVENTION

In one embodiment, carrier selective contacts using a carrier selective material may be formed on solar cells using a laser transfer process or other deposition process. The process may include the carrier selective materials, or may include a precursor to the carrier selective material which is subsequently converted to a carrier selective material by a chemical transformation. These processes may produce localized regions of carrier selective contacts in the various embodiments discussed further herein.

In another embodiment, roll-to-roll processing for a solar cell with carrier selective contacts comprises multiple lamination steps to form the layers of a multilayer foil assembly (MFA). These lamination steps may merge a dielectric insulating layer between two metal foil layers. In some cases, the lamination steps may include other layers, such as bonding layers or the like. The roll-to-roll processing may also include steps performed at various stages to form desired openings or perforations in one or more of the metal foil and dielectric layers of the multilayer foil assembly. In some cases, it may also be desirable to perform opening formation steps to provide fiducial holes that may be utilized to aid aligning layer(s). Once the multilayer foil assembly foil assembly is completed, the multilayer foil assembly can be bonded to a silicon wafer to enable contact to various polarity regions on the silicon wafer, which may be a substrate that has been processed to provide desired layers, patterned layers, or patterning on the front or back surfaces.

In yet another embodiment, a solar cell structure including carrier selective contacts may provide a front surface. The solar cell structure may provide both contacts on a rear surface. In some cases, the rear surface may optionally provide passivation, doped, and/or conductive structure layers. A laser transfer or other deposition process may be used to create regions of a first polarity and optionally regions of a second polarity for the rear surface. The MFA, such as described above, provides a first metal foil in electrical communication with polarity regions of the rear surface. The multilayer foil assembly may also provide a second metal foil that is spaced apart from the first metal foil by a dielectric layer. The first metal foil and/or the dielectric layer may include openings through the entirety of these layers, and these openings may be utilized to form electrical contact to other polarity regions.

In another embodiment, MFAs for a solar cell with carrier selective contacts may provide a first metal foil in electrical communication with polarity regions of the rear surface. The multilayer foil may have aligned openings in the first metal foil layer, the dielectric layer, and/or the second metal foil layer in the region of a base contact to the silicon substrate. An additional metal layer may contact the base region to the second metal foil layer.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 8A-8D show cross-section views of an illustrative embodiment of a partially assembled solar cell;

FIGS. 12A-12G show cross-section views of an illustrative embodiment of a partially assembled solar cell;

DETAILED DESCRIPTION

Figure 1:
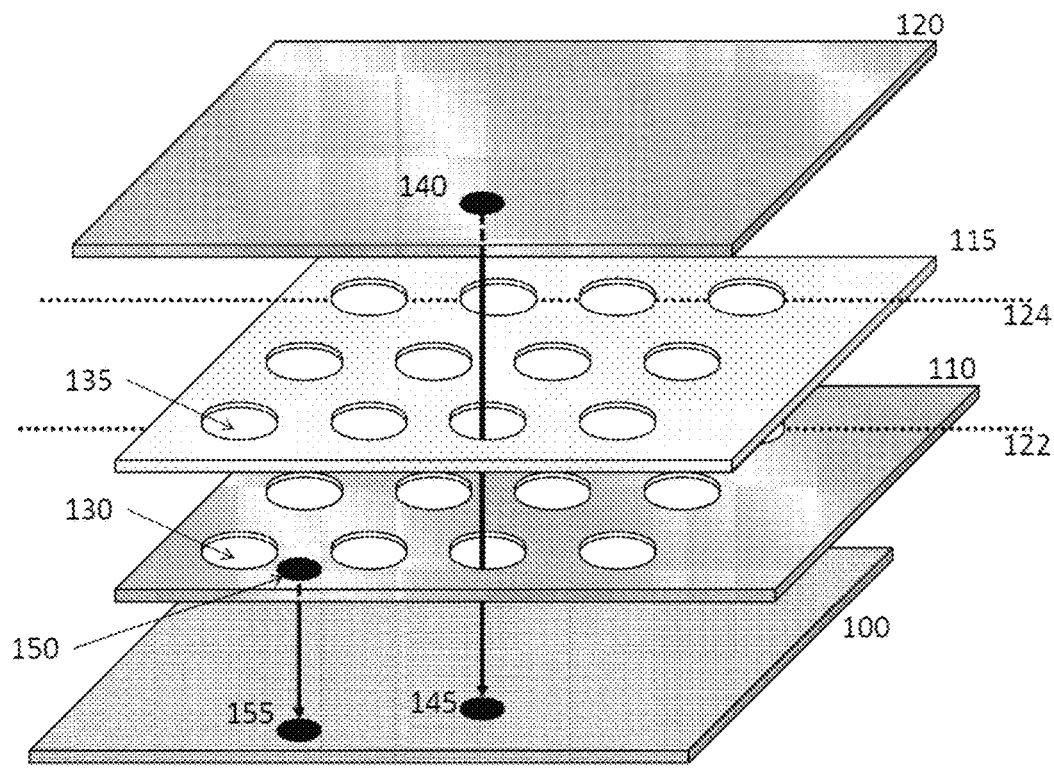
FIG. 1 shows an exploded view of an illustrative embodiment of a multilayer metallization scheme.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise. The following general description sections provided herein are applicable to the various embodiments discussed further herein. It shall be understood that various combinations of the options discussed allow for numerous suitable variations.

General Description Multilayer Metallization:

A nonlimiting example of an exemplary solar cell with multilayer metallization is described herein and is generally applicable to the various embodiments discussed further herein. FIG. 1 shows an exploded view of a multilayer metallization scheme applicable to the various embodiments discussed further herein. A substrate (100) has on its surface a first metal layer or metal foil layer (110) representing a first electrical contact, a dielectric layer (115) and a second metal layer or metal foil layer (120) representing a second electrical contact. The dielectric layer is sandwiched between the first and second metal foils. Electrical current generated from the cell can be extracted from first and second electrical contacts. The dielectric layer (115) serves to insulate the first and second conductive layers, which are respectively coupled to different doping regions. While the exploded view shows the layers separated, it shall be understood that the layers may be in contact in the order shown.

Many of the figures discussed herein are shown in cross sectional views for illustrative purposes. For example, the cross sectional views may be from positions (122) or (124). It should be understood that the cross section is for illustrative purposes and in all cases the individual layers may be contiguous layers as shown in FIG. 1.

The first metal layer (110) and second metal layer (120) may be metal foils that comprise thin continuous sheet sections of flexible metal, which, at some point in the process, may have been freestanding thin layers of metal. As utilized herein a multilayer foil assembly or metal foil assembly (MFA) may be utilized interchangeably. A multilayer foil assembly or metal foil assembly refer to one or more layers of metal foil(s), dielectric layer(s), or a combination thereof, which may be utilized in the various processing methods discussed herein for forming solar cells. As a nonlimiting example, one or more of the metal foils may be a component of a metal foil assembly, which may include one or more material layers, such as the metal foil and a dielectric layer. In some embodiments, the materials layers of the MFA, such as metal foil(s) or dielectric/insulator layer(s), are freestanding layer(s) rather than layers formed by depositing materials on a substrate. The MFA may be formed as an assembly prior to bonding to a substrate, or the metal foil assembly may be formed and result upon the substrate by the successive placement and bonding of several layers. These layers formed upon the substrate may themselves be referred to as metal foil assemblie(s), and the metal foil assemblie(s) may be bonded to other metal foil assemblie(s) or other layers that are joined to create a new metal foil assembly.

A semiconductor substrate (100) useful in a solar cell can have regions of different polarity, typically referred to n-type or p-type regions, and a general doping type of the base substrate, referred to as the base doping. One or more of the polarity regions may be produced by the presence of a carrier selective contact. For ease, regions of polarity that are the same as the base doping type can be referred to as the base or base region(s), and regions that are of the opposite doping type can be referred to as the emitter or emitter region(s). A built-in potential exists between the emitter and base regions making it desirable to couple metal contacts to the emitter and base regions respectively. The operation of the solar cell is achieved by illuminating the semiconductor and collecting the current driven by the built-in potential by connecting one of the metal contacts (110 or 120) to one polarity region, and the other metal contact to the other polarity region. As a nonlimiting example, region (155) of a first polarity (e.g. n-type or p-type) is connected to a region (150) on the first metal contact. Region (145) of second polarity, which is the opposite of region (155), is connected to region (140) of the second metal contact. The polarity regions (145) and (155) may be formed on the substrate prior, during, or after the application of the metal contact layers, or as a result of the metal contact application process. The substrate (100) may also contain other functional layers such as conductors, semiconductor, and passivation layers.

In order for the second metal layer (120) to properly operate and make contact with the substrate (100) without making contact to the first metal layer (110), the first metal layer may have openings (130) aligned with the location of the second metal contact (140,145). The dielectric layer may also have similarly aligned openings 135. The openings may be of any suitable shape, including circular, square, oval, rectangular, or the like. The latter can be useful in the case of laser processing using an elongated laser beam shape. The openings may be produced by during fabrication of the MFA. Alternatively, one or more of the openings may be produced by processing of the MFA when attached to the substrate 100. Such processing may include mechanical means such as drilling or milling, chemical means such as etching or plasma etching, and energetic means such as laser processing.

Figure 2A:
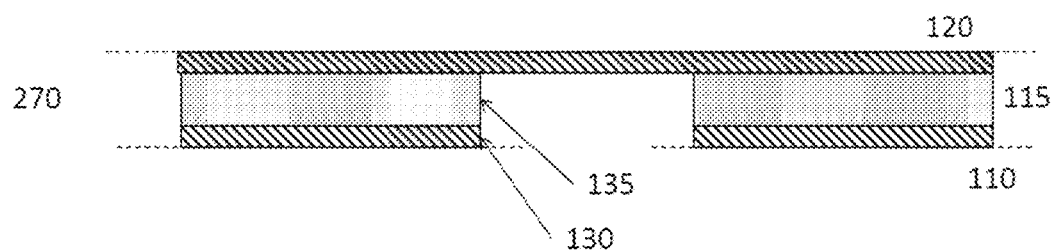
FIGS. 2A-2E show various illustrative embodiments of different multilayer foil assemblies.
Figure 2B:
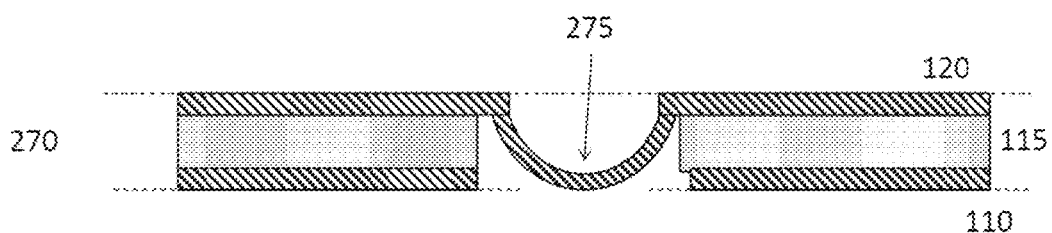

Multilayer Foil Assembly (General):

This general discussion shall be understood to be suitable for various embodiments discussed further herein. Embodiments involving the use of two metal foils, for example, but not limited to, two aluminum foils, separated by an insulating or dielectric layer to form a back-contact solar cell that are suitable for the various embodiments are discussed herein. A multilayer foil assembly (MFA) may refer to one or more of these metal foils and/or dielectric layers bonded to form a foil laminate. Individual layers of the MFA may be patterned to produce openings and/or vias. The following are nonlimiting examples of MFA structures. Referring to FIG. 2A, in one embodiment, an MFA (270) contains a first metal or foil layer (110), a dielectric layer (115), and a second metal or foil layer (120) where the dielectric layer is sandwiched between the foil layers. The MFA may contain dielectric openings (135) and first metal foil openings (130) that are aligned to allow contact from the substrate to the second metal foil. Referring to FIG. 2B, in some embodiments, the second metal foil (120) may be dimpled (275) at locations corresponding to the openings to aid in contact to the substrate. The dimpling process may occur at any step in the MFA or cell fabrication. In one embodiment the dimpling may occur on foil (120) prior to attachment to dielectric (115) during MFA fabrication. In another embodiment, the dimpling may occur after fabrication of the MFA and creation of dielectric opening (135) and first metal foil opening (130), but prior to attachment to a solar cell. In yet another embodiment, the dimpling may occur during or after the process of attachment of the MFA to a solar cell.

Figure 2C:
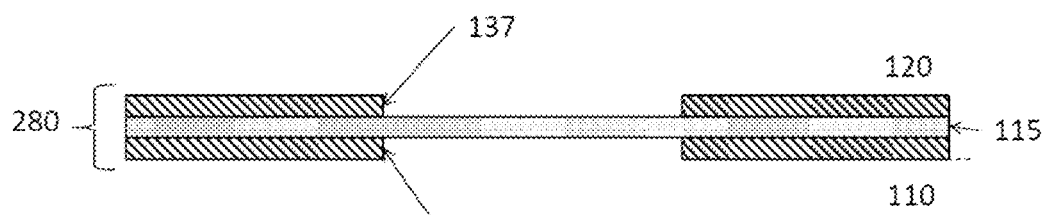
Figure 2D:
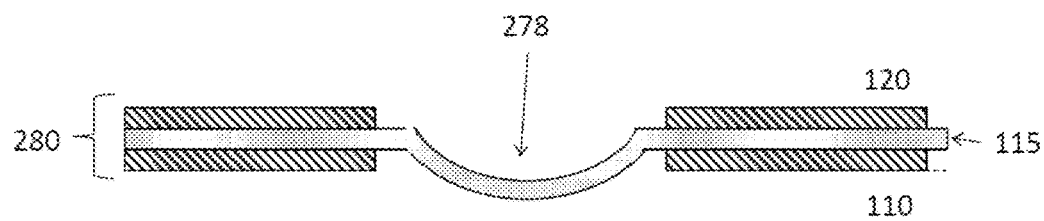
Figure 2E:
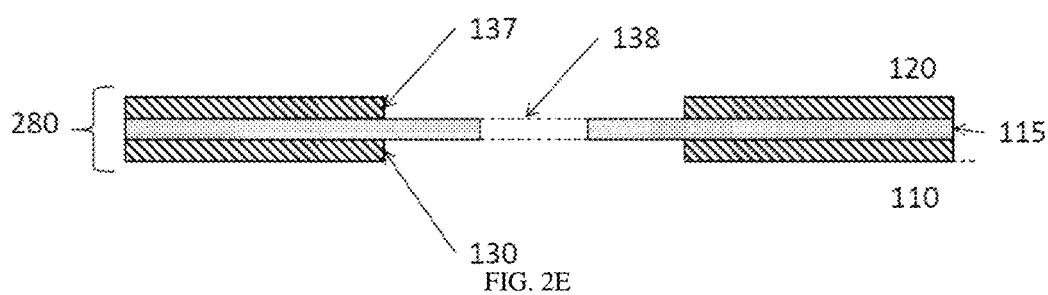

Referring to FIG. 2C, in another embodiment an MFA (280) contains a first metal or foil layer (110), a dielectric layer (115), and a second metal or foil layer (120). MFA (280) demonstrates a different patterning arrangement than MFA (270), with first metal foil openings (130) substantially aligned with second metal foil openings (137). Referring to FIG. 2D, in some embodiments, the dielectric (115) may be dimpled (278) in order to make eventual contact with a substrate. As with MFA (270), dimpling may be formed in any part of MFA fabrication or cell attachment and/or processing. Referring to FIG. 2E, in yet another embodiment, the dielectric layer may have perforation(s) (138). The perforations may be aligned with the openings in the metal foils, and may also be slightly smaller than the foil openings. The perforations (138) may be formed in any part of MFA fabrication or cell attachment and/or processing.

In some embodiments, the solar cell fabrication involves three separate processes where wafer cleaning, texturing and passivation (including heterojunction formation or tunnel oxide formation) are performed in one process, while the roll-to-roll processing of the multilayer foil assembly can be performed simultaneously in a separate operation. The foil assembly and wafer substrate may then be merged, such as by laser doping and bonding to the passivated wafer in a final solar cell processing step.

Figure 3:
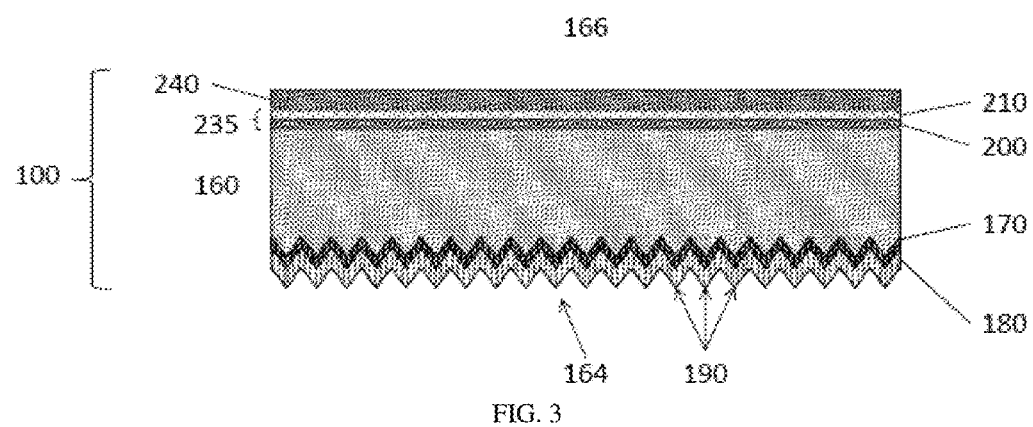
FIG. 3 shows a cross-section view of an illustrative embodiment of a partially assembled solar cell.

General Description of Substrate:

This general discussion shall be understood to be suitable for various embodiments discussed further herein. A more detailed view of a nonlimiting example of a substrate (100) composed of a base semiconductor (160) is shown in FIG. 3. The substrate may have a front surface (164) for receiving light and a rear surface (166) containing active layers. In some embodiments, the front surface (164) may be textured (190) to improve light absorption, and may optionally have various passivation (170) and antireflection (180) layers, as is described in more detail below. On the back surface or back side, the substrate (100) may have various doping and/or junction inducing layers (235) represented by exemplary individual layers (200,210), such passivation layer(s), doped layer(s), or combinations thereof. The back side may also have conductive layer(s) (240), also referred to as a rear conductive structure, as described in more detail below. It is understood that the various layers can be applied by any suitable fabrication process and at any suitable point in the fabrication process.

The suitable substrate (100) may be a semiconductor wafer of any convenient size or shape. Nonlimiting examples of suitable semiconductors include group IV semiconductors, such as silicon or germanium; group III-V semiconductors, such as gallium arsenide or indium phosphide; and group II-VI semiconductors, such as cadmium telluride. In some embodiments, the substrate (100) thickness is equal to or below about 1 mm. The surface of the semiconductor wafer may be polished. In some embodiments for solar cell applications, the starting wafer may have a surface that is textured (190) to promote light absorption. The surface texture (190) may be applied by mechanical means, laser processes, chemical etching processes, or the like. In some embodiments for silicon wafers, the surface texture (190) may contain exposure of predominantly <111> and <110> facets, such as is obtained by treatment with solutions containing KOH or NaOH in conjunction with surfactants such as alcohols. In some embodiments, the front surface (164) may be chemically smoothed by treatment with various etchants. A starting wafer that has a rough texture resulting from the wafer sawing process can be chemically smoothed with hydroxide containing etchants, such as NaOH, KOH, TMAH (tetramethylammonium hydroxide), combinations thereof, or the like. The concentrations of these etchants can be equal to or greater than 10%, and etching may be performed at temperatures equal to or greater than 50° C. The resulting surface (164) may be substantially smoothed relative to the starting rough surface, but may still contain pits, depressions, or surface undulations.

As a nonlimiting example, the surface (164) of the wafer may be textured with very fine features to produce a gradient refractive index, also referred to as a nanoscale texture or black silicon. In some embodiments, the anti-reflective etching process may be a single stage process that includes a catalytic metal and etching chemistries. In some embodiments, the anti-reflective etching process may be a multistage process that includes: a catalytic metal deposition stage to deposit a metal on the substrate, and an etching stage that texturizes surface(s) of the substrate to reduce reflectivity. In some embodiments, the catalytic metal deposition stage may occur utilizing a thin layer fluid process that includes steps similar to the etching stage as discussed further herein. In some embodiments, the catalytic metal may exist in a deposition fluid as a precursor that is reduced or plated on the substrate surface. As a nonlimiting example, catalytic metal solutions contain a catalytic metal and a fluorine containing compound, such as hydrofluoric acid, that is dispensed and/or dispersed into a thin fluid layer on the substrate to deposit the catalytic metal on the substrate. In some embodiments, the deposition fluid is dispersed or spread out into the thin layer with a thickness of 5 mm or less. In other embodiments, the deposition fluid is dispersed or spread out into the thin layer with a thickness of 1.5 mm or less. A thickness of the thin layer of deposition fluid may be controlled by controlling a separation distance between the first surface of the substrate and an opposing surface of a dispersion mechanism opposite the first surface. The deposition fluid may remain in contact with the substrate for about 5 seconds to 5 minutes for the catalytic metal deposition stage. After the catalytic metal deposition stage, the metal catalyst has been deposited on portions of the substrate (100), and the anti-reflective etching process may proceed to the etching stage to texturize (190) the surface of the substrate where the metal catalyst was deposited on the substrate.

In some embodiments, the substrate (100) may have different surface textures on the front and rear surfaces. The front surface may be textured (100) to promote light absorption, while the rear surface may be textured or smoothed to promote compatibility with the contacting and laser firing processes. The front surface may have textures (100) as discussed above while the back surface may be a nominally smooth surface obtained by mechanical polishing, chemical mechanical polishing (CMP), or chemical etching. Differential textures on front and back may be achieved by any suitable means. The different surfaces may be subjected to different treatments by protecting one of the surfaces with a protective coating while immersing the substrate in a treatment bath or processing in a chamber. The substrate may be subjected to a single side process by maintaining the substrate partially immersed in a fluid, where one face is immersed and the other face is not. Alternatively, the substrate may be processed in a chamber where only one side of the substrate is treated.

The starting substrate (100) may be highly pure, and thus nearly intrinsic in doping character, or may have a particular bulk doping leading it to be n-type or p-type. This presence of doping modifies the bulk resistivity of the substrate. In some embodiments, substrates may have a bulk resistivity equal to or between about 0.1 to 50 ohm-cm. In some embodiments, substrates may have a bulk resistivity equal to or between about 1 to 25 ohm-cm. In some embodiments, the substrate may be n-type doped silicon grown by the Czochralski method. The examples discussed above and herein are provided for illustrative purposes only, and it will be recognized that substrates are in no way limited to the particular examples discussed.

General Description of Front Passivation:

This general discussion shall be understood to be suitable for various embodiments discussed further herein. Front passivation layers (170) may be applied by any suitable means. As a nonlimiting example, the front passivation may include a process such as atomic layer deposition (ALD). The material deposited by ALD may include aluminum oxide ($Al_2O_3$) or silicon dioxide ($SiO_2$). As a nonlimiting example, the passivation process may include ALD deposition of aluminum oxide using trimethylaluminum (TMA) as a precursor. The substrate (100) may be annealed after deposition of the ALD deposited layer to improve or alter the passivation quality. As another nonlimiting example, the front passivation (170) may be achieved by exposing the substrate to oxygen at elevated temperature to produce a thermal oxide.

In some embodiments, the front passivation (170) may be a semiconductor layer. A nonlimiting example of a semiconductor passivation layer is hydrogenated amorphous silicon (a-Si:H). The a-Si:H may be deposited by any suitable means, including plasma enhanced chemical vapor deposition (PECVD) or hot wire chemical vapor deposition (HWCVD). In some embodiments, the deposition may take place at temperatures ranging from equal to or between approximately 100° C. to 350° C., or from equal to or between approximately 200° C. to 300° C. The a-Si:H passivation may be undoped, indicating that no intentional doping compounds are included. Alternatively, the a-Si:H passivation layer may be lightly doped by a doping compound. In some embodiments, the a-Si:H layer is relatively thin (e.g. equal to or between about 2 to 20 nm) to minimize light absorption at the front surface. The front passivation may include several layers of a-Si:H or other semiconductor materials with various doping levels. In some embodiments, a passivation (170) structure may contain a first layer of intrinsic a-Si:H in contact with the silicon substrate and a second layer of doped semiconductor such as doped a-Si:H. These and other structures may produce a front surface field to prevent charge carrier recombination at the front surface.

General Description of Rear Emitter:

This general discussion shall be understood to be suitable for various embodiments discussed further herein. Referring to FIG. 3, the rear emitter may be composed of one or more layers (235) that modify the charge carrier concentrations in a portion of the rear of the cell. For example, a rear emitter may be composed of a heterojunction (an interface that occurs between two layers or regions of dissimilar semiconductors) or tunnel junction (a barrier, such as a thin insulating layer or electric potential, between two electrically conducting materials) or a thermally diffused homojunction. These structures may be applied by any suitable means. A heterojunction layer may comprise any suitable semiconductor or semiconductor layers with an appropriate band structure, mechanical and/or adhesion properties. In some embodiments, the heterojunction layer is formed by the application of a passivation layer (200) and a doped layer (210). As a nonlimiting example, the passivation layer may be intrinsic or very lightly doped a-Si:H. The doped layer may be doped a-Si:H with any dopant or dopant concentration that is suitable for modifying charge carrier concentrations in the solar cell. The intrinsic or lightly doped a-Si:H layer can be any suitable thickness that promotes good charge carrier transport while maintaining integrity. In some embodiments, the thickness can be in the range equal to or between approximately 2 to 20 nm, or equal to or between approximately 4 to 10 nm.

A rear doped semiconductor layer (210) may be applied by any suitable means. A rear doped semiconductor layer (210) may comprise any suitable semiconductor with the appropriate band structure, mechanical, and/or adhesion properties. As a nonlimiting example, the rear doped semiconductor layer (210) may be doped silicon. The silicon may be amorphous, microcrystalline, or polycrystalline depending upon growth conditions. The silicon layer may be deposited by any suitable means, including plasma enhanced chemical vapor deposition (PECVD) or hot wire chemical vapor deposition (HWCVD). In some embodiments, the deposition takes place at temperatures ranging equal to or between approximately 150° C. to 450° C., or equal to or between approximately 200° C. to 400° C. Doping may be accomplished by including a chemical dopant in the deposition feed stream. Nonlimiting examples of dopant chemicals include borane, diborane, phosphine, and/or arsine. The dopant may be present in the feed stream at concentrations from equal to or between approximately 0.5% to 20% on a molar basis relative to the silicon precursor. In some embodiments, dopant concentrations are from equal to or between approximately 2% to 10%.

The passivation layer (200) may also be any suitable insulator or large band-gap material with the appropriate band structure, mechanical, and/or adhesion properties. With certain types of insulators or high bandgap semiconductors utilized as the passivation layer (210), the approach shown in FIG. 2 may be termed a tunnel junction. Nonlimiting examples of tunnel junction materials are $SiO_2$, $SiN_x$, or $Al_2O_3$. A tunnel junction may be applied by ALD, PECVD, thermal oxidation (where applicable), or chemical oxidation (where applicable).

In some embodiments, the rear emitter may be formed by modifying the properties of the silicon layer (160) at its rear surface or within. For example, a rear emitter may be formed by doping the rear surface region of the silicon layer (160) with the appropriate atom. Nonlimiting examples of suitable dopants are aluminum, gallium, boron, phosphorous, antimony, and arsenic. The doping may be accomplished with a diffusion process, in which the substrate (160) is heated to a predetermined temperature in the presence of the dopant or a precursor to the dopant. In some embodiments, the diffusion may occur at temperatures ranging from 800° C. to 1100° C., and times ranging from 10 minutes to 2 hours. In some embodiments, doping may also be accomplished with ion implantation followed by high temperature annealing. As a nonlimiting example, an emitter may be formed by doping a portion of the substrate to form the desired doped region, as opposed to depositing exemplary layers (200) and (210).

It is understood that abovementioned examples are merely illustrative, and the rear emitter forming layers (235) can be accomplished with any suitable selection of materials or processes that accomplish emitter behavior.

General Description of Rear Passivation:

This general discussion shall be understood to be suitable for various embodiments discussed further herein. In some embodiments, the rear surface (166) of solar cell is passivated to provide a low surface recombination velocity (SRV) surface, and a process can be performed later in the process to produce an emitter function. In that case, layer combination (235) may be composed of one or more layers and can serve as a passivation structure and can have similar properties as described for the front passivation (170). The rear passivation may include layers which also modify the charge carrier concentrations in that portion of the cell. Such layers may contain a fixed charge that interacts with charge carriers in the substrates, possibly producing inversion or accumulation layers. The rear passivation layers may have similar properties and compositions to those described above for front side passivation.

General Description of Rear Conductive Layers:

This general discussion shall be understood to be suitable for various embodiments discussed further herein. A rear conductive structure (240) may be applied to the back of the cell. In some embodiments, the conductive structure may comprise any suitable conductive material, including metals, highly doped semiconductors, and transparent conducting oxides (TCO). Further, some embodiments may utilize combinations of these materials may be used. As a non-limiting example, a layer of a TCO followed by a layer of metal may be used. The TCO/metal combination may impart improved back reflection to the solar cell; thus, improving light capture and performance. In some embodiments, the rear conductive structure (240) may include additional conductive layers that are applied in subsequent processing.

Nonlimiting examples of TCOs include indium tin oxide, doped zinc oxide, and/or doped tin oxide. Nonlimiting examples of dopants in TCOs include aluminum, gallium, and/or fluorine. Nonlimiting examples of metal conductive layers include aluminum, copper, nickel, silver, gold, and/or antimony. TCOs and metals may be deposited by any suitable deposition technique. Nonlimiting examples of deposition methods for TCOs may include sputtering, plasma enhanced chemical vapor deposition, and/or atomic layer deposition and for metals may include thermal evaporation, electron beam evaporation and sputtering.

The thickness of a TCO, that may comprise one element of rear conductive structure (240), may be in the range of equal to or between 10 to 1000 nm, or equal to or between 30 to 200 nm. The thickness of a metal layer, that may comprise one element of rear conductive structure (240), may be in the range of equal to or between 10 to 4000 nm, or equal to or between 20 to 2000 nm. It one embodiment the rear conductive structure (240) comprises a TCO layer followed by a thin layer of metal, in which the thin metal layer aids in providing good electrical contact to subsequently applied metal foil assemblies discussed herein.

General Description of Polarity Regions:

This general discussion shall be understood to be suitable for various embodiments discussed further herein. A solar cell may have polarity regions exhibiting a particular polarity characteristic. The polarity characteristic may be defined by parameters including, but not limited to, the polarity (n-type or p-type), the level or concentration of dopant atoms, the presence of a carrier selective contact, and the Fermi level. The polarity regions may be created by methods including incorporation of dopant atoms in the substrate, application of layers on the substrate that modify charge carrier concentrations or movement in the substrate, and may be created during any point in the cell fabrication process. In some embodiments, a polarity region may be created before, during, or after the application of the multilayer foil, and different doping regions may be created at different points in the process Like interdigitated back contact (IBC) solar cells, it is desirable to have a contact in electrical connection with a first polarity region, and another contact in electrical contact with a second polarity region that is electrically isolated from the first contact. In one embodiment a polarity region with the opposite polarity as the base may be referred to as an emitter as described above. In one embodiment a polarity region with the same polarity as the base may be referred as a base contact or base region.

A polarity region may occupy part or all of the surface of the substrate. A polarity region may be created by processing part or all of an existing polarity region, thus modifying its characteristics. Referring back to FIG. 1, in some embodiments, a substrate may have a first polarity region (e.g. 155) covering a portion of the substrate, and a second polarity region (e.g. 145) of opposite polarity may be created within the first polarity region by locally modifying the region with a laser or other process. In one embodiment, a substrate may have a first polarity region that contains a given concentration of dopant producing a first polarity. Second polarity regions comprising localized areas may be produced by a laser doping process that locally incorporates sufficient dopant capable of reversing the polarity such that second doping regions are created despite the presence of the original dopant. Doping in the first and second regions may be understood to include doping by local incorporation of dopant or doping in heterojunction or adjacent layers. In another embodiment, a first polarity region may be modified by an etching or ablation process that locally removes or modifies the first polarity region to allow formation of a second polarity region by an additional process. In further discussion below, it will be apparent that the various processing options may produce a variety of polarity region patterns on the substrate.

Figure 4:
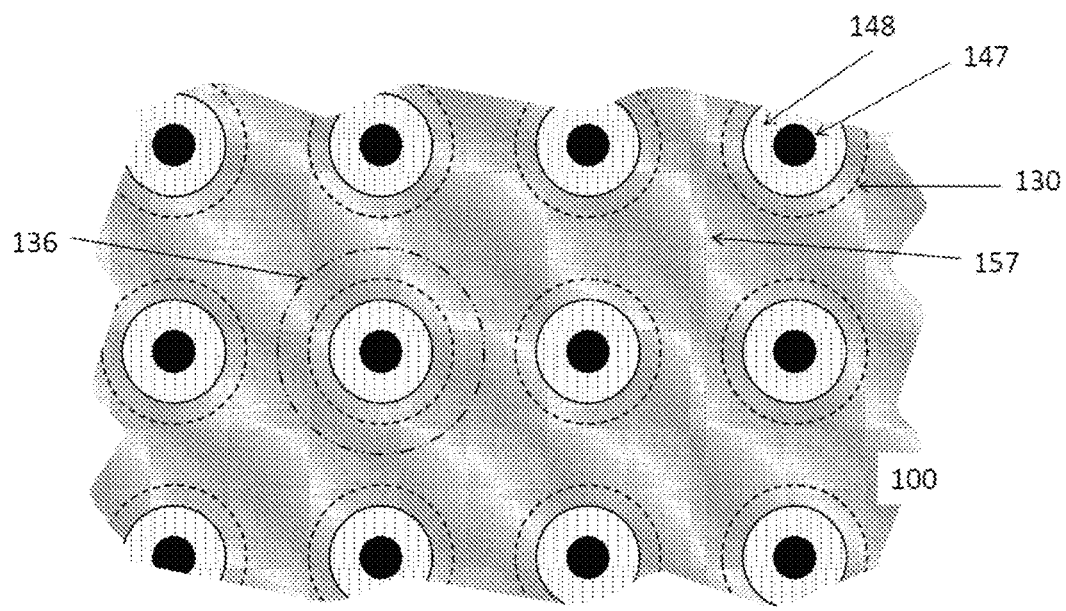
FIG. 4 shows a top view of a doping pattern with a localized polarity region
Figure 5:
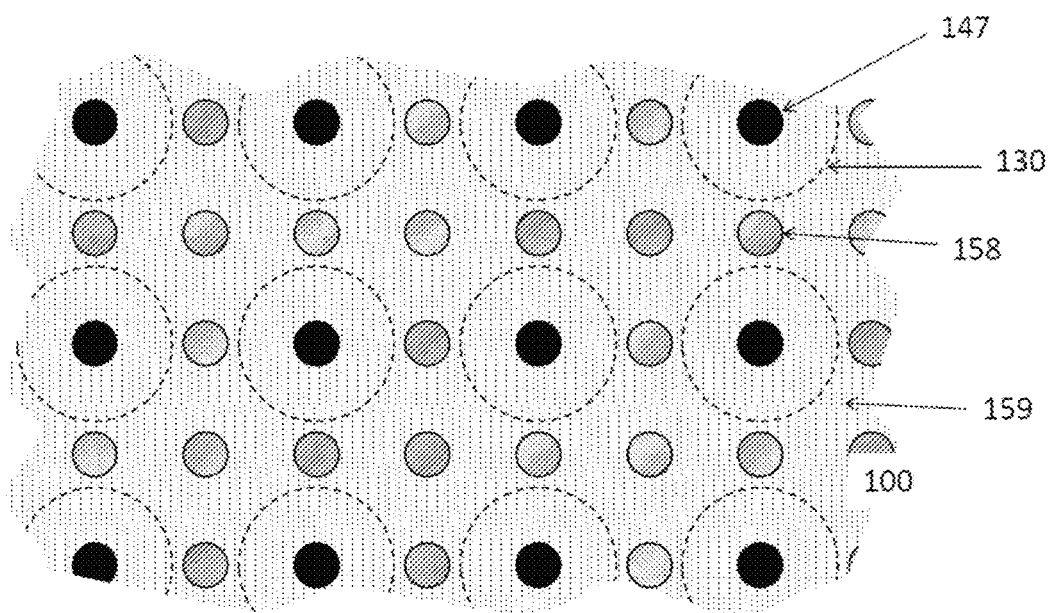
FIG. 5 shows a top view of a doping pattern with a two localized polarity regions

FIGS. 4-5 show illustrative embodiments of different polarity region patterns that may be produced. FIG. 4 is a top view of a substrate (100) that contains a first polarity region (157). The patterning of FIG. 4 may result when the wafer selected for processing is already doped (e.g. polarity corresponding to first doping region (157)). The substrate further contains a second polarity region (147) patterned or aligned with metal layer openings (130) or dielectric layer openings (not shown). Polarity regions (147) can be referred to as localized contacts. In some embodiments, each doping region (147) may comprise one or more laser fires. In some embodiments, polarity regions (147) may be a carrier selective contact. The first polarity region (157) can be continuous or contiguous, such that each second polarity region (147) is encircled or surrounded by the first polarity region in the plane of the substrate. It shall be understood that encircled or surrounded by indicates the perimeter of the second polarity regions (147) are substantially surrounded by the first polarity region (157). In some embodiments, encircled or surrounded by may mean that a radius from the second polarity region exists such that greater than 80%, or preferably greater than 90% of the resulting circumference (e.g. exemplified by 136), is occupied by the first polarity region. In contrast, conventional interdigitated back contact designs provide polarity regions where the fingers interface into gaps of opposing finger, but none of the polarity regions surround the other polarity region. The projection of the openings in the metal foil assembly, for example the first metal foil opening (130), show that the openings should be sized properly to avoid electrical contact between the metal foil layers (110, 120) and/or polarity regions (147,157). As a nonlimiting example, the first polarity region can extend to within the position of the openings, although that is not required. It is contemplated also that a region of intermediate polarity or light doping (148) can exist between the first and second polarity regions. In some embodiments, the region (148) may be electrically neutral with no significant polarity. In some embodiments, a first polarity region (157) is in electrical contact with a first metal foil and a second polarity region (147) is in electrical contact with a second metal foil. In this embodiment, the first metal layer can be continuous or contiguous in a similar manner as the first polarity region (157), such that each second polarity region (147) is encircled by the first metal layer, but not in electrical contact with the first metal layer. In some embodiments, encircled may mean that a radius from the second polarity region exists such that greater than 80%, preferably greater than 90% of the resulting circumference (exemplified by 136) is occupied by the first metal layer.

FIG. 5 is a top view of a substrate (100) that contains localized first polarity regions (158) of a first polarity characteristic in addition to second polarity regions (147) as described above. The patterning of FIG. 5 may result when the wafer selected for processing is undoped or lightly doped. Polarity regions (158) can be referred to as localized contacts. In some embodiments, each polarity region (158) may comprise one or more laser fires. In some embodiments, polarity regions (158) may be created by laser firing through a first metal layer, using the metal of that layer as a dopant, or using a material coated on that layer as a dopant. In some embodiments, polarity regions (147) and/or (158) may be carrier selective contacts. In some embodiments, a first polarity region (158) is in electrical contact with a first metal foil. Second polarity regions (147) are similar to those described in the prior embodiment. Second polarity regions (147) are arranged to be in electrical contact with a second metal foil in the same manner as discussed previously above. However, because the first polarity regions (158) do not encircle or surround the second polarity regions (147) in the manner described above, a large region of intermediate polarity, or an undoped or lightly doped region (159) is present.

Regarding the novelty of the patterning in FIGS. 4-5, in a conventional interdigitated finger design of an all back contact cell, one series of metal fingers would need to contact to the first polarity regions, while another set of metal fingers patterned on the same plane and isolated from first set by a gap or insulating material would need to contact the second polarity regions. It can be seen from study of the example multi-layer arrangement and patterns in FIGS. 4-5 that rather than isolating sets of fingers via a gap or insulating material in the same plane as the fingers, the present design isolates using the metal foil opening design discussed.

In some embodiments, the first polarity region and the second polarity may have additional electrical isolation features to avoid significant shunt current. Electrical isolation can be achieved by physical separation of the polarity regions with portions of the substrate that have a low polarity level. Electrical isolation can also be achieved by relying upon the polarity characteristics of the first and second polarity regions to produce a rectifying junction that does not allow substantial photogenerated current to pass. Isolation can be achieved by a process steps including, but not limited to, laser processing, laser etching, wet etching, or dry etching.

Carrier Selective Contacts:

This general discussion shall be understood to be suitable for various embodiments discussed further herein. A carrier selective contact can refer to any method of contacting a substrate that allows charge carriers of principally one polarity to flow through the contact. Carrier selective contacts can alternatively be referred to as heterojunction contacts or passivated contacts. The carrier selective contact may be composed of a single material with the correct passivation, energy band, and/or work function properties. Alternatively, the carrier selective contact may be composed of a stack of materials that achieve the desired properties, such as passivation, doped, and/or rear conductive structure layer. The efficacy of carrier selective contacts may depend upon the doping of the base substrate. Carrier selective contacts generally utilize band offsets that allow the conduction of one type of carrier (e.g. the electron) to flow through the contact while acting as a minority carrier mirror and reflecting the other carrier (e.g. the hole) back into the semiconductor (e.g. the silicon). The carrier selective contact can often be formed at relatively low temperatures and does not require doping of the semiconductor, thus minimizing defect formation and Auger recombination.

Non-limiting examples of carrier selective contacts that induce a region of n-type polarity in silicon and allow electron transport through the contact include compounds such as titanium oxides, lithium fluoride, cesium fluoride, potassium fluoride, $C_{60}$, cesium oxide, magnesium fluoride, zinc oxide, zinc sulfide; metals such as calcium, magnesium, lithium; and semiconductors such as n-doped silicon, n-doped polysilicon, n-doped amorphous silicon, n-doped amorphous silicon carbide. Non-limiting examples of carrier selective contacts that induce a region of p-type polarity in silicon and allow hole transport through the contact include compounds such as molybdenum oxides, tungsten oxides, PEDOT:PSS, copper phthalocyanines, copper thiocyanate, and copper oxides; and semiconductors such as p-doped silicon, p-doped polysilicon, p-doped amorphous silicon, p-doped amorphous silicon carbide.

It may be desirable for the silicon surface at the location of the carrier selective contact to be passivated. In some cases, materials such as those listed above may adequately passivate the surface. Alternatively, an additional passivation layer which permits charge carrier transport may be applied directly to the surface of the silicon prior to application of the carrier selective material. Such passivation layers may be insulators in which case charge transport may occur via quantum mechanical tunneling. Non-limiting examples of such layers include silicon dioxide, aluminum oxide, and silicon nitride. Alternatively, the passivation layer may exhibit semiconductive charge transport. Non-limiting examples of such layers include intrinsic hydrogenated amorphous silicon, and intrinsic hydrogenated amorphous silicon carbide.

The carrier selective and passivating layers may be of any thickness that provides the correct electrical and charge transport processes. Layer thickness may range from 0.1 to 100 nm, preferably 0.2 to 10 nm. Any of the above materials or systems may be connected to a metal. Non-limiting examples of connection metals include aluminum, copper, silver, gold, and nickel, and titanium. Within a single device, different metals may be used for different polarity carrier selective contacts since properties of the metal such as work function may impact their performance when used in conjunction with specific carrier selective materials. In some embodiments multilayers of metals may be used. In a non-limiting example, a metal of low work function may be used as the first material to contact a carrier specific material, followed by another metal. Non-limiting examples include layers of calcium, lithium, or magnesium under layers of aluminum, which could be used in forming selective contacts that allow electron transport. Metal layer thickness may be in the range of 2 to 5000 nm, preferably 10 to 2000 nm.

Figure 6:
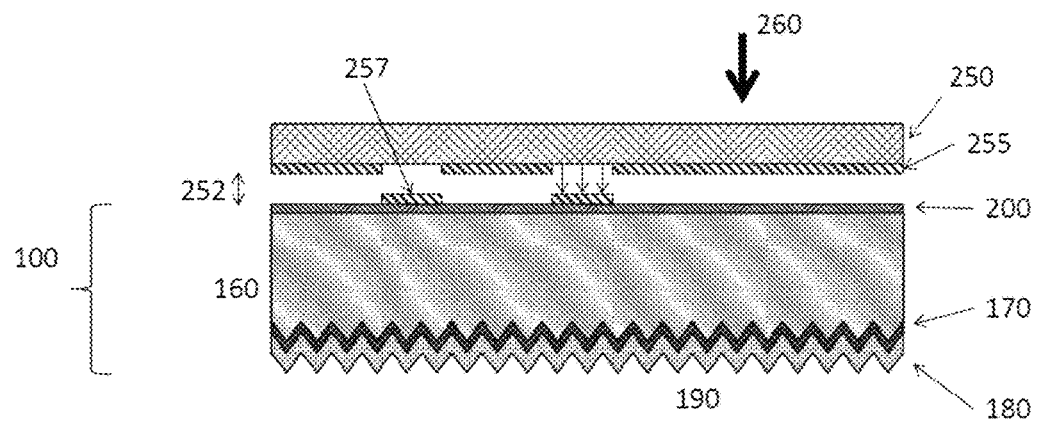
FIG. 6 is an illustrative embodiment of a laser transfer process used to deposit a carrier selective material.

Carrier Selective Contacts by Laser Transfer:

This general discussion shall be understood to be suitable for various embodiments discussed further herein. The carrier selective materials may be applied by a laser transfer process. Referring to FIG. 6, a carrier selective material or precursor to a carrier selective material (255) is coated on a laser transfer carrier (250). The carrier (250) may be any material through which a suitable laser radiation can pass. Non-limiting examples of laser transfer carriers include glass, polymers, and crystalline materials. The carrier is positioned in proximity to a substrate with an optional gap (252). A laser pulse (260) causes deadhesion or volatilization of the carrier selective material or precursor to a carrier selective material (255), and subsequent transfer to the substrate, yielding a spatially defined deposition of carrier selective material (257). This allows for a simple and accurately patterned deposition of carrier selective contacts. In some embodiments, a material may be applied between the carrier selective material or precursor to a carrier selective material (255) and the laser transfer carrier (250) to improve the transfer or deadhesion of the carrier selective material by the laser pulse. Non-limiting examples of such materials include amorphous silicon, and polymers. This type of material layer acts as a release layer or dynamic release layer, which readily volatilizes at low laser fluences thus promoting the transfer of the carrier selective material.

In some embodiments, the material (255) on the laser transfer carrier (250) may be the same compound as the resultant carrier selective contact deposited on the substrate (100). Alternatively, the material (255) may be a precursor that transforms into the desired material for the carrier selective contact deposited on the substrate (100) during the laser transfer processing. As nonlimiting examples, such transformations may include thermal transformation activated by the laser, and chemical transformation initiated by the laser transfer processing, optionally enabled by the presence of another chemical species. Nonlimiting examples of chemical transformation may include oxide formation due the presence of an oxidizing species in gap (252), or nitride formation, enabled by the presence of a nitrogen containing species in gap (252). In some embodiments, a gas enabling the chemical transformation (e.g. oxygen or nitrogen) may be supplied to the gap (252) during, after, or both during and after the laser transfer processing. Further, non-limiting examples of chemical transformations include the formation of titanium oxide using a titanium coated layer (255) and oxygen gas; the formation of molybdenum oxide using a molybdenum coated layer (255) and oxygen gas; and the formation of tungsten oxide using a tungsten coated layer (255) and oxygen gas. Other examples of oxidizing species include, but are not limited to, water, hydrogen peroxide, ozone, and alcohols. As discussed previously above, in some embodiments the precursor could be first transferred onto the substrate (100) and subsequently transformed chemically (e.g. oxidation, nitride formation, or the like). For example, a layer of Ti could be laser transferred and subsequently oxidized by exposure to an oxidizing environment such as air, oxygen, ozone, hydrogen peroxide or an oxygen plasma under appropriate conditions.

In some embodiments, the carrier selective contact may be applied directly to a target substrate by any deposition method including solution deposition, vacuum evaporation, physical vapor deposition, chemical vapor deposition, or plasma enhanced chemical vapor deposition. In one embodiment, the deposition source may be the same compound as the resultant carrier selective contact. In another embodiment, the deposition source may be a precursor that transforms to the carrier selective contact. In one embodiment, the transformation may occur during the deposition. Non-limiting examples of such processing include vacuum evaporation or physical vapor deposition in the presence of chemical species as described above. Non-limiting examples include thermal evaporation or sputtering of titanium, zinc, molybdenum, or tungsten in the presence of oxygen containing species, nitrogen containing species, or sulfur containing species. In another embodiment, the transformation may occur by processing a deposited film to convert it to the desired carrier selective contact. Non-limiting examples of such transformation processes involve the exposure of a deposited film of titanium, zinc, aluminum, molybdenum, or tungsten to an oxidizing species. The oxidizing species may include oxygen, water, hydrogen peroxide, ozone, and alcohols. The oxidizing species may be in an excited or radical form, including the use of plasma or remote plasma sources. The transformation may occur at elevated temperature in the range of 40 C to 400 C, preferably 50 C to 200 C. The deposited layers may be thin so that oxidation of the entire film thickness can occur at low temperatures. The layer thickness can less than 10 nm, preferably less than 2 nm, although thicker films are contemplated with alternate oxidation mechanisms.

In one embodiment, the chemical transformation of a deposited species may occur in a stepwise fashion. As a non-limiting example, a thin layer of a carrier selective contact precursor may be deposited followed by exposure to another chemical species to for the carrier selective contact. This process sequence or cycle may be repeated to produce a thicker layer of carrier selective material. The layer thickness of each step may be less than 5 nm, preferably less than 2 nm. The number of cycles may be any suitable number to provide the desired final layer thickness.

All Local Contact Carrier Selective Cell with MFA

Figure 7:
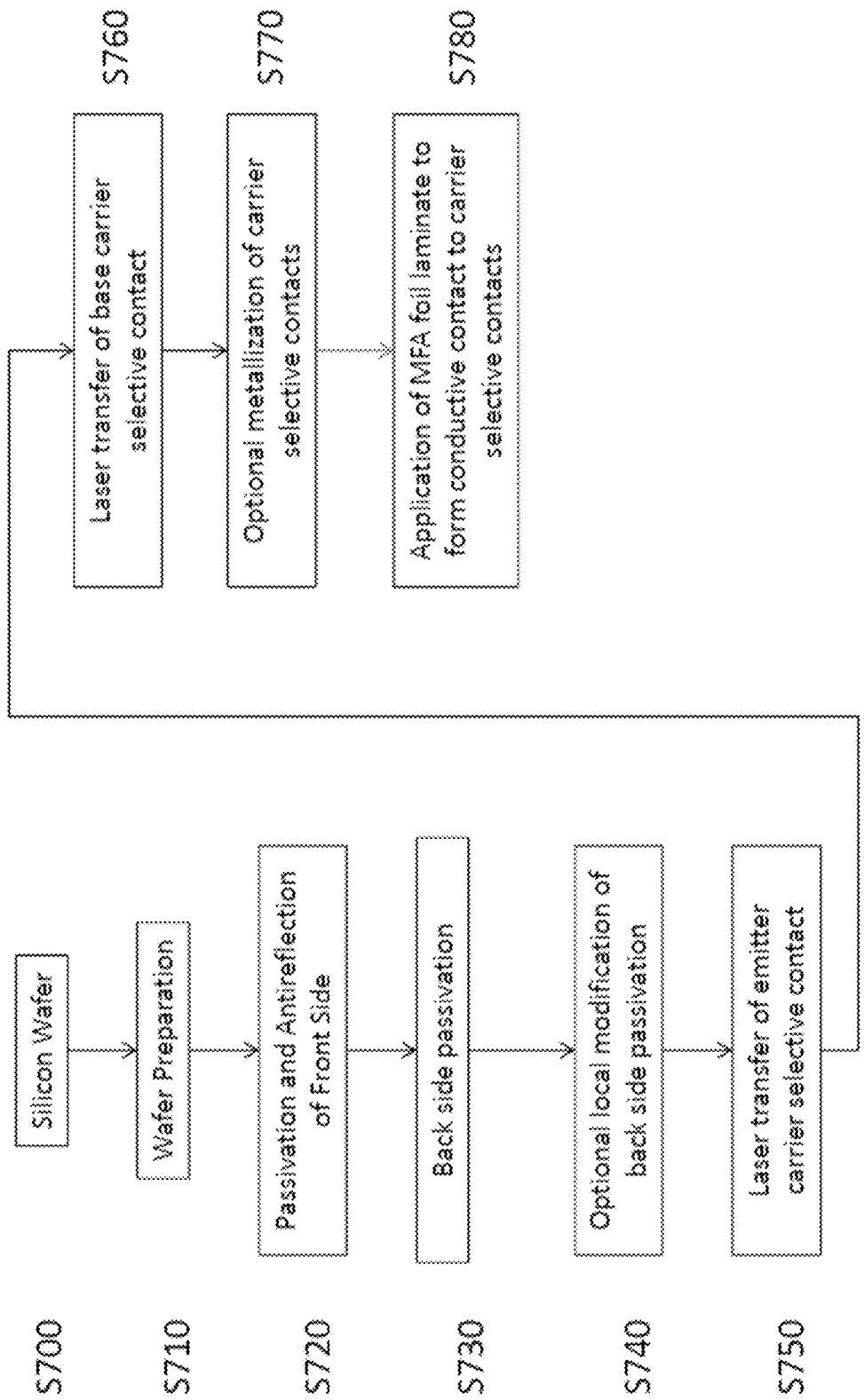
FIG. 7 is an illustrative embodiment of a process flow forming a solar cell with multilayer metallization and local carrier selective contacts.

In one embodiment, a solar cell with localized carrier selective contacts for both polarities and multilayer metallization is fabricated as described by the process flow in FIG. 7 and the device structures in FIGS. 8A-8D. The resulting cell may have localized polarity regions as exemplified by FIG. 5.

Figure 8A:
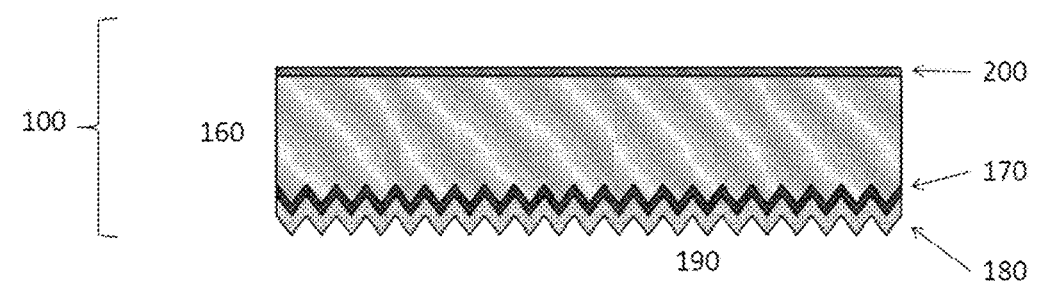

Referring to the process flow in FIG. 7, a silicon wafer is selected (S700) and is prepared by etching, cleaning, and texturing steps (S710) as described above. Antireflection and passivation (S720) of the front side may be performed as described above. In the next step (S730), rear passivation layers may be applied as discussed above. FIG. 8A shows the device after these steps with passivation layer (200) on the rear of the device.

Figure 8B:
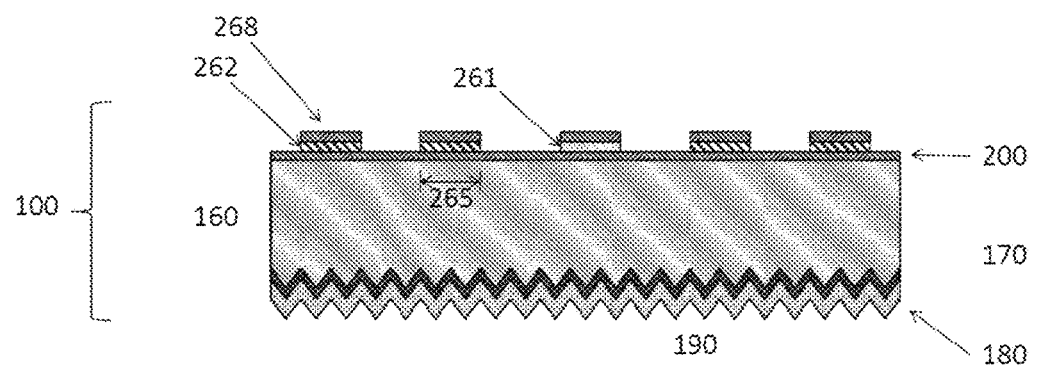

Referring back to process flow in FIG. 7 and device structure in FIG. 8B, the passivation layer (200) may be optionally modified locally (step 740) in order to allow better performance of the carrier selective contacts. The local modification may occur in a region of the carrier selective contacts (265) to the first pattern of base 261, the second pattern of emitter 262, or both, and may comprise thinning, removal, or chemical modification of the passivation layer (200). Thinning or removal may include chemical etching or physical processes such as laser ablation that partially or fully remove the passivation layer (200). Chemical modification may include processes intended to locally modify the chemical or electrical properties of the passivation layer, such as, but not limited to, improving conductivity, improving charge transport, or the like. Local carrier selective contacts may be deposited in desired patterns by laser transfer or the like as described above to produce base (261) and/or emitter (262) contacts (steps S750 and S760). As shown by the different shading for portions of the base (261) and emitter (262) contacts, the materials deposited and corresponding pattern formed by transfer processing are different, and as such, different laser transfer carriers with different material(s) or precursor(s) may be utilized for the respective base and emitter laser transfer steps.

A metal layer (268) may be optionally applied to the carrier selective contacts (step S770) to facilitate contact with the carrier selective contact. The metal layer may be deposited by any conventional means, including laser transfer, vacuum evaporation, or solution coating. It is contemplated that in some embodiments the metal layers may be a different composition for the respective base and emitter carrier selective contacts. It may be advantageous thereby to tailor the work function and other characteristics of the metal to produce optimum contact with each carrier selective material. In FIG. 8B, the metal is shown in one embodiment as having a location similar to that of the associated carrier selective contacts. Alternatively, the metal layers may extend substantially past the carrier selective contacts, and may even extend in a continuous fashion among two or more carrier selective contacts of the same polarity. Any metal pattern may be useful, provided that some degree of insulation or isolation exists between the metal provided for the emitter contacts (262) and the metal provided for the base contacts (261) and provided that there are no regions where excessive shunting or leakage occurs to the silicon wafer (160).

Referring back to process flow in FIG. 7 and device structure in FIGS. 8C-8D, a suitable MFA or a MFA (270) as shown in FIG. 2A-2B may be applied to the substrate, aligned and/or bonded (step S780). Any method of conductive bonding as described below may be used. The application of carrier selective regions in prior steps may produce base regions (281) and emitter regions (282) as discussed previously. In the case of application of the MFA structure (270), it is desirable to have first polarity region contact a first of the metal foils of the MFA, while the other polarity region contacts the other metal foil that isolated from the first foil. In a non-limiting example depicted in FIG. 8D, the base regions (281) connect to the second metal foil (120) via a dimple (275), while the emitter regions (282) connect to the first metal foil (110). Further, the first metal foil (110) and the second metal foil (120) are separated by a dielectric layer (115) to isolate the contacts from each other.

Local Base Contact Carrier Selective Cell with MFA

Figure 9:
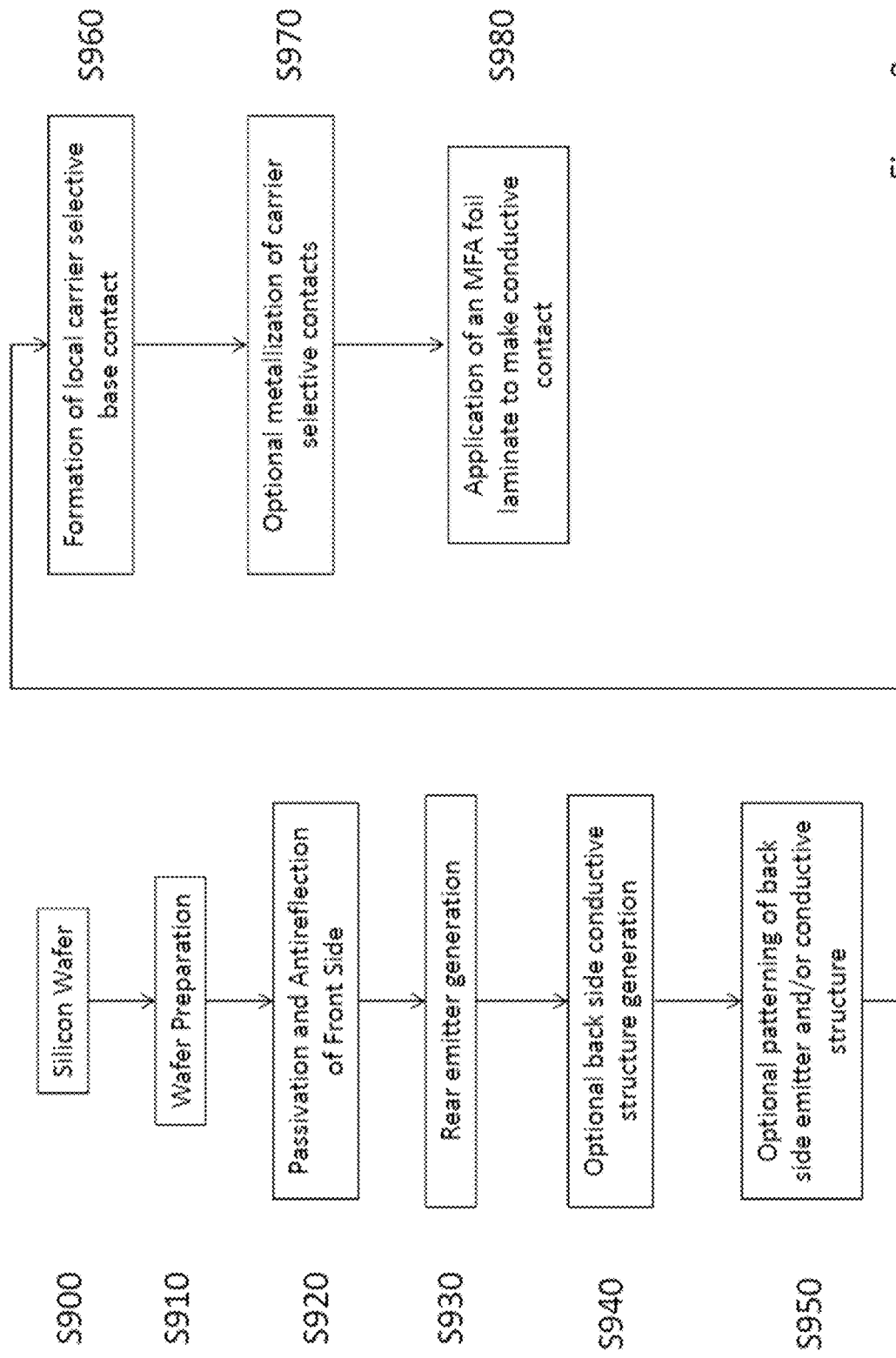
FIG. 9 is an illustrative embodiment of a process flow forming a solar cell with multilayer metallization, a first polarity region forming the emitter, and carrier selective base contacts.
Figure 10A:
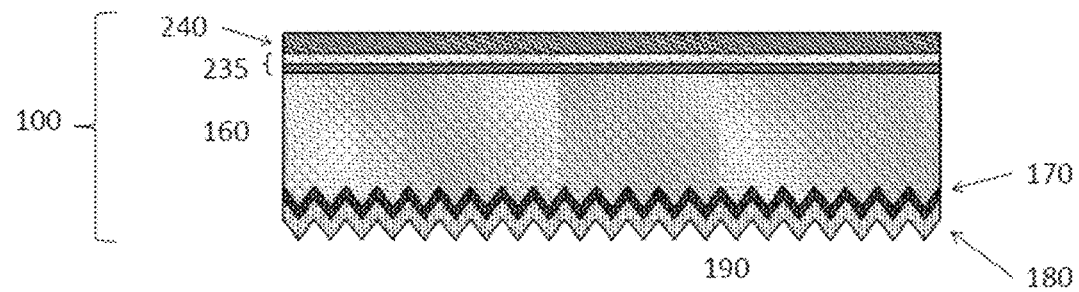
FIGS. 10A-10C show cross-section views of an illustrative embodiment of a partially assembled solar cell.
Figure 10B:
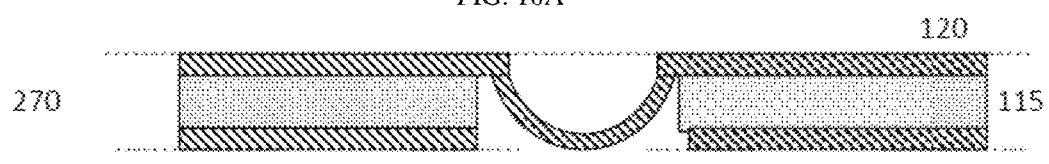
Figure 10B:
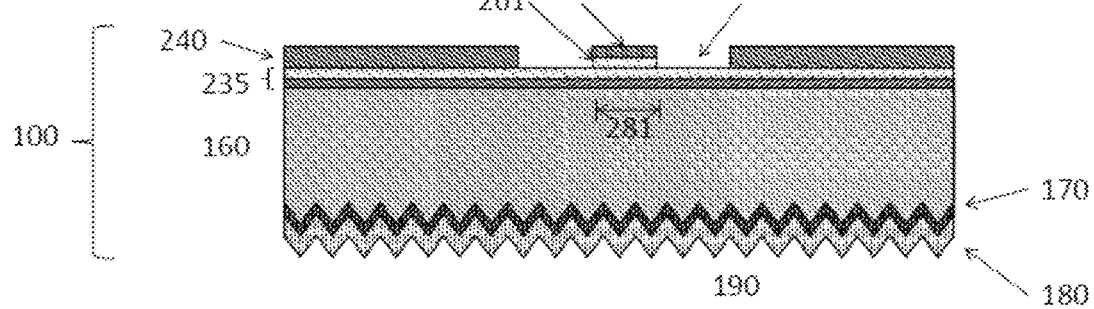
Figure 10C:
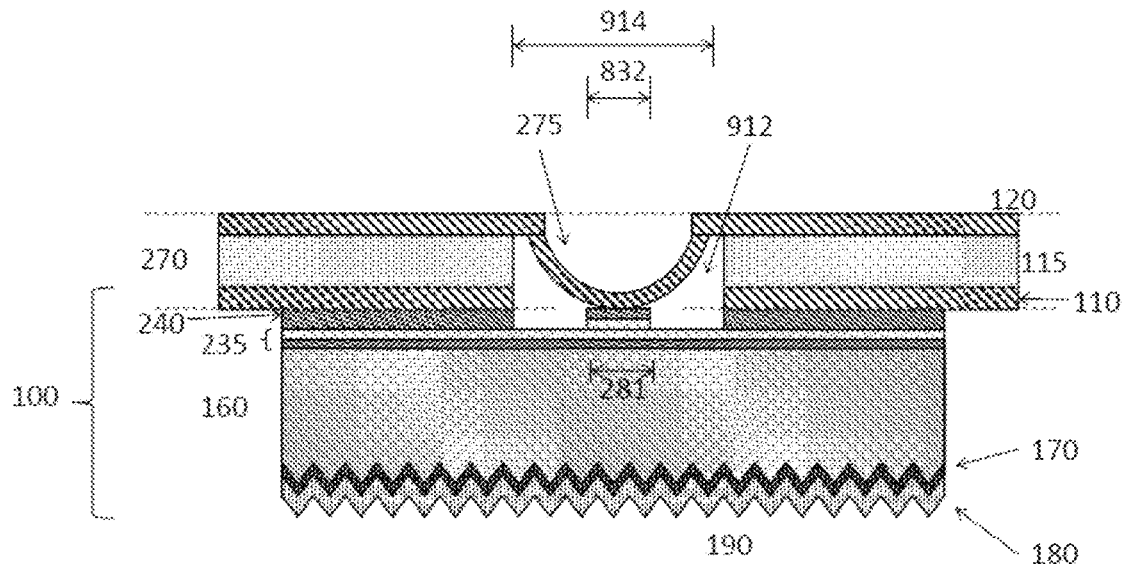

In one embodiment, a solar cell is fabricated comprising a first polarity region forming the emitter, carrier selective regions created by laser transfer for the base contact, and multilayer metallization, as described by the process flow in FIG. 9 and the device structures in FIGS. 10A-10C. The resulting cell may have a combination of large area and localized polarity regions as exemplified by FIG. 4.

Referring to the process flow in FIG. 9 and FIG. 10A, a silicon wafer is selected (S900) and is prepared by etching, cleaning, and texturing steps (S910) as described above. Antireflection and passivation (S920) of the front side may be performed as described above. In the next step (S930), rear emitter layers (235) may be applied as discussed previously above. In step (S940), an optional rear conductive structure (240) may be applied as discussed above. FIG. 10A shows the device after these steps with emitter layer(s) (235) and conductive structure (240) on the rear of the device.

Referring now to the process flow in FIG. 9 and device FIG. 10B, the rear emitter layers and/or rear conductive structure may be patterned to produce open areas (290) in between the base and emitter regions that will prevent shunting from the emitter to any base contact or base connected metal foil. In one embodiment, both the rear conductive structure (240) and the rear emitter layers (235) area patterned. In another embodiment, only the rear conductive structure (240) may be patterned. The latter may be preferred when the rear emitter has high sheet resistivity and/or provides suitable passivation. In yet another embodiment, the rear conductive structure (240) may be patterned and the rear emitter layers (235) may be thinned or otherwise modified to provide certain properties. Non-limiting examples of such properties include increased local sheet resistance, reduced doping or polarity effect, or reduced thickness to allow compatibility with subsequently deposited carrier selective contacts.

Base carrier selective contacts (261) may be deposited by laser transfer or the like (step S960) as described above to create base regions (281). A metal layer (268) may be optionally applied to the carrier selective contacts (step S970) to facilitate contact with the carrier selective contact. The metal layer may be deposited by any conventional means, including laser transfer, vacuum evaporation, or solution coating.

A suitable MFA or a MFA (270) as shown in FIG. 2A-2B may be aligned and bonded to the device (step S980). Any method of conductive bonding as described below may be used. In the case of application of the MFA structure (270) it is desirable to have one of the metal foils of the MFA in contact with the emitter while the base regions (281) contact the other metal foil. In a non-limiting example as depicted in FIG. 10C, the base regions (281) connect to the second metal foil 120 via a dimple (275), while the rear conductive structure (240) and therefore rear emitter regions (235) connect to the first metal foil (110). Connection of the base region is enhanced by dimpling (275) of the second metal foil (120)

Local Base Contact Carrier Selective Cell with MFA and Simplified Carrier Selective Deposition Process In one embodiment, a solar cell is fabricated comprising a first polarity region forming the emitter, a carrier selective base contact, and multilayer metallization. The carrier selective regions are created by a simplified patterning and deposition process that produces the carrier selective region and provides connection to the MFA. The resulting cell may have a combination of large area and localized polarity regions as exemplified by FIG. 4.

Figure 11:
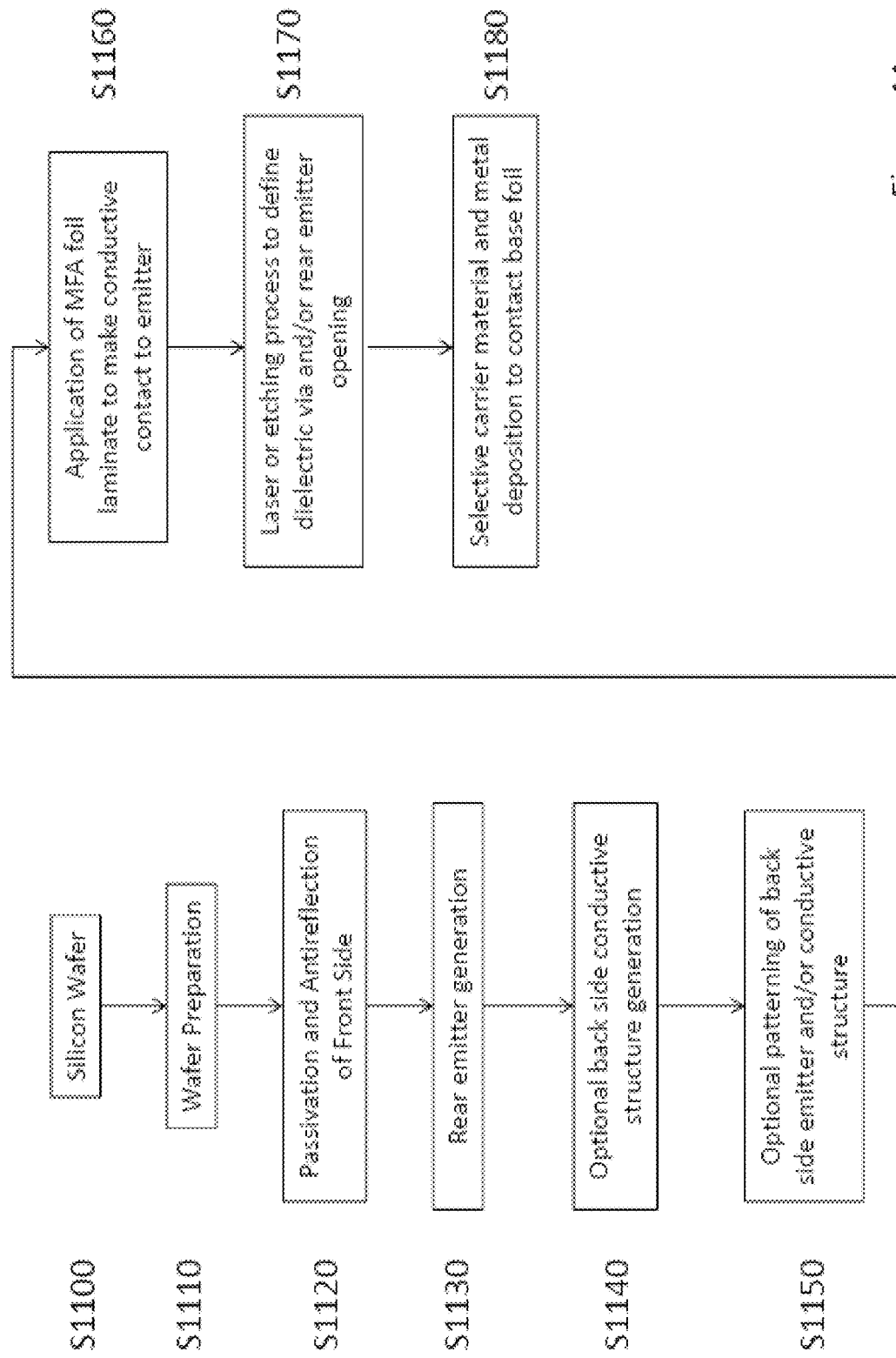
FIG. 11 is an illustrative embodiment of a process flow forming a solar cell with multilayer metallization, a first polarity region forming the emitter, and carrier selective regions created by a simplified patterning and deposition process.
Figure 12D:
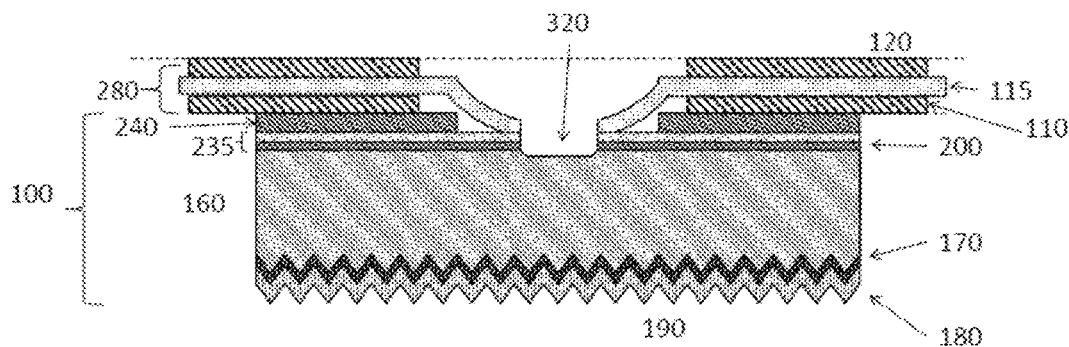

Referring to the process flow in FIG. 11 and device FIGS. 12A-12E, a silicon wafer is selected (S1100) and is prepared by etching, cleaning, and texturing steps (S1110) as described above. Antireflection and passivation (S1120) of the front side may be performed as described above. In the next step (S1130), rear emitter layers (235) may be applied as discussed above. In step (S1140), an optional rear conductive structure (240) may be applied as discussed above. FIG. 12A shows the device after these steps with emitter layer(s) (235) and conductive structure (240) on the rear of the device.

Referring now to the process flow in FIG. 11 and device FIG. 12B, the rear emitter layers and/or rear conductive structure may be patterned in base regions and/or small parts of emitter regions to produce open areas (290) that will prevent shunting from the emitter to any base contact or base connected metal foil. In one embodiment, the rear conductive structure (240) and/or the rear emitter layer(s) (235) are patterned. In another embodiment, only the rear conductive structure (240) may be patterned. The latter may be preferred when the rear emitter has high sheet resistivity and/or provides suitable passivation. In yet another embodiment, the rear conductive structure (240) may be patterned and/or one or more of the rear emitter layers (235) may be thinned or otherwise modified to provide certain properties. Non-limiting examples of such properties include increase local sheet resistance, reduced doping or polarity effect, or reduced thickness to allow compatibility with subsequently deposited carrier selective contacts.

In some embodiments, the open area (290) may be patterned by an etching process, including chemical etching or plasma etching. In a typical etch process, areas of the sample not intended to be etched may be protected by a mask or resist (295). The resist may be a polymer that is applied by coating, spraying, screen printing, inkjet printing, or other forms of printing, and may be further patterned by processes including but not limited to laser ablation and/or photopatterning. In one embodiment, the polymer used as the mask (295) may be any suitable conductive polymer. Further, the mask (295) may stay on the sample and later serve as an element of the conductive bonding of a portion of the MFA to the remaining portion of the rear conductive structure (240) on the substrate. In some embodiments, the open area (290) may be directly patterned by processes including laser ablation or laser ablation combined with other processes, such as etching. While layers such as the resist or conductive bonding element may not be apparent in some figures, it is understood that such a bonding or patterning layer may be present between the MFA and the substrate layers.

Referring back to process flow in FIG. 11 and device structure in FIGS. 12B-12C, a suitable MFA or a MFA (280) as shown in FIG. 2C-2E may be applied to the substrate, aligned, and/or bonded (step S1160). Any method of conductive bonding as described below may be used. In the case of application of the MFA structure (280) it is desirable to have one of the metal foils of the MFA contact the emitter. In a non-limiting example as depicted in FIG. 12C, the rear conductive structure (240) and therefore rear emitter regions (235) connect to the first metal foil (110). The dimple (278) that allows the dielectric (115) to contact the substrate surface may be made at any time. Due to the flexibility of typical dielectrics the dimple (278) may be made during the application of the MFA (280) to the substrate. Additional adhesives may be applied to the MFA or to the substrate to ensure that the dielectric (115) makes good contact with the substrate.

Referring back to process flow in FIG. 11 and device structure in FIG. 12D, laser process(es) may be used (step S1170) to define an opening (320) in the dielectric (115) and/or in one or more of the emitter layers (235). The opening (320) may be formed with one or more pulses from lasers of the same or different wavelengths. In a preferred embodiment, a single pulse or train of pulses from the same laser may be used to simultaneously create opening (320) in both the dielectric (115) and/or the rear emitter layers (235). The laser process may also cause opening (320) to penetrate into the silicon substrate (160). The depth of penetration may be less 1 μm, preferably less than 100 nm.

The laser ablation process to produce opening (320) may be designed to produce the minimum amount of damage to the silicon substrate. Not wishing to be bound by theory, low damage laser pulses may use short wavelength and/or short duration pulses to ensure that the laser energy is absorbed primarily near the silicon surface causing rapid ablation with minimal transfer of thermal energy to surrounding areas of the silicon. Short wavelength laser pulses may be less than 532 nm wavelength, preferably less than 400 nm wavelength. Short duration pulses may be less than 100 ns, preferably less than 50 ns. Very short pulses such as picosecond or femtosecond pulses are contemplated.

The laser ablation process may effectively remove the dielectric layer (115) as well as any adhesives and other materials present in the region of opening (320). A dielectric layer may have high optical absorption at the laser wavelength. The high absorption may be achieved by using a polymer with intrinsic absorption in these ranges, such as polyimide or polycarbonate. The high absorption may also be achieved by loading the dielectric with dyes or particulate absorbers such as organic chromophores and/or carbon black. Another alternative is to use a UV laser with a wavelength that has high absorption in the dielectric. Similarly, any other materials present in the region in which opening (320) will be produced may have high optical absorption to allow for effective laser ablation. Loading the adhesives with absorbers or using adhesives with intrinsic absorption at the desired laser wavelength may be used.

The exposed silicon base surface in opening (320) may be treated in order to clean or improve the quality of the surface after laser treatment. Such treatments include chemical etching, surface termination with hydrogen, and plasma treatments. Surface termination with hydrogen may be achieved by exposure to solutions including those containing hydrofluoric acid or those containing free fluoride ion in acidic environments. Plasma treatments may include but are not limited to those containing oxygen, hydrogen, or fluorine sources. Treatments that are known to etch silicon may also be used. Such etchants may contain bases such as NaOH, KOH, and tetramethylammonium hydroxide. Such etchants alternatively may include other known silicon etchants including mixtures of hydrofluoric acid and oxidants.

Figure 12E:
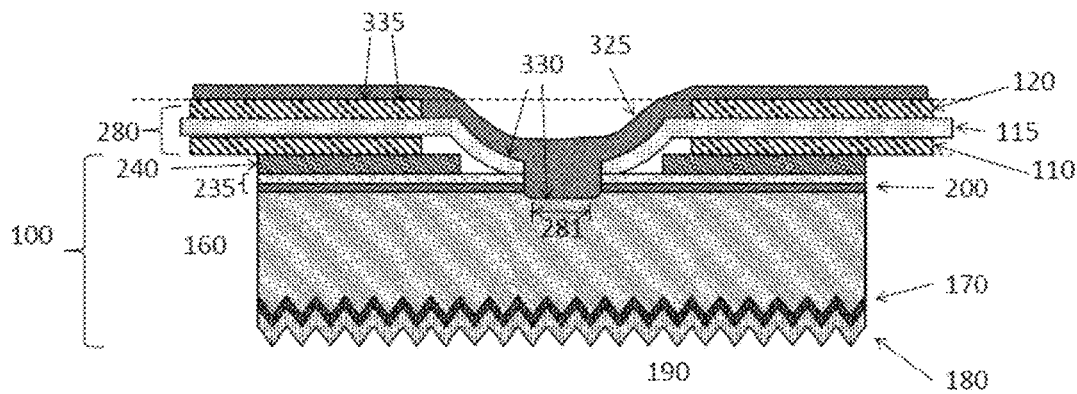

Referring back to process flow in FIG. 11 and device structure in FIG. 12E, a carrier selective contact material may be deposited in accordance with suitable methods discussed previously, and may be followed by a metal deposition may be applied to form layer (325). It is understood that layer (325) may be composed of several layers including a lower layer of a carrier selective material at the bottom interface (330) and upper layers of conductive metal. The deposited metal in layer (325) serves to accept current from the interfacial regions of base contact (281) where it is connected to the base silicon (160), and transport it to the low resistance foil (120) at for example areas (335). It is understood that conduction of current originating at base contact (281) may flow through layer (325) and enter foil layer (120) at a plurality of locations. While the thickness of layer (120) in a 156 mm square standard size cell will need to be greater than 2 μm thick, preferably greater than 5 μm thick in order to handle the full cell current, layer (325) may be considerably thinner since it need only transport current from individual base contacts over a short distance to the foil (120). Layer (325) may be from 50 nm to 2000 nm thick, preferably 100 nm to 1500 nm thick. The deposition of layer (325) does not need pattering and may be deposited over the entire wafer. Alternatively, patterning means such as a shadow mask may be used to protect areas of the wafer. A patterned deposition of layer 325 may be produced by using a laser transfer process in which a carrier selective material may be laser transferred first to make contact with regions (330), followed by a metal deposition that permits contact of regions (330) to foil regions (335). A combination of laser transfer and uniform deposition processes may be used.

Figure 12F:
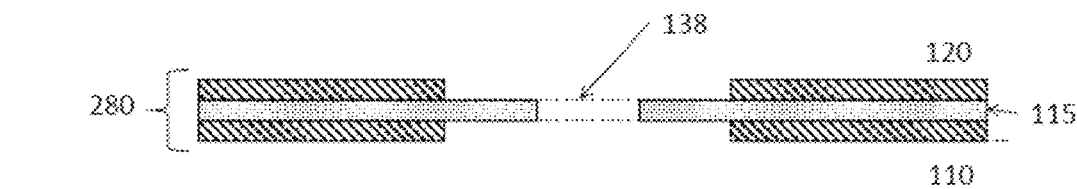
Figure 12G:
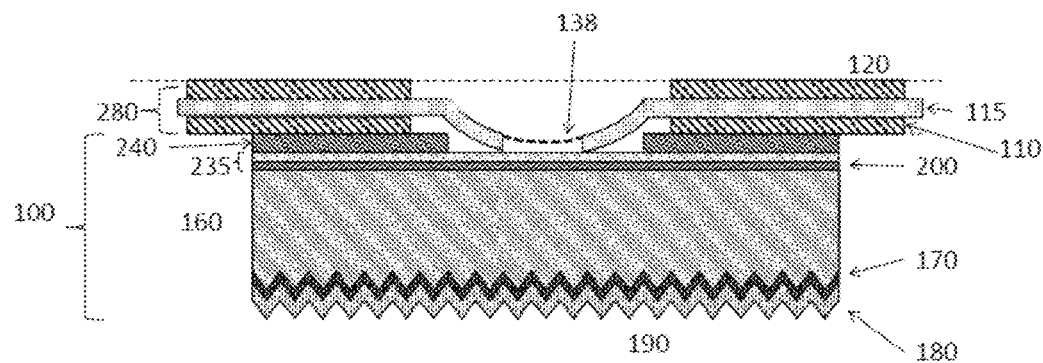

Referring back to the process flow in FIG. 11 and device structure in FIG. 12F, in another variation of the process flow an MFA (280) containing a perforation (138) already in the dielectric prior to attachment (e.g., FIG. 2E) may alternatively be applied (step 1160). The resulting structure (FIG. 12G) may contain an opening through the dielectric layer (115) to the substrate in the region of perforation (138). The perforation (138) allows any etching or modification process (step S1170) to more easily be used to etch necessary layers of the substrate (e.g., layers 235) to reveal or etch into the base (160). One skilled in the art will recognize that the resulting structure of such a process is functionally similar to FIG. 12D, and the process flow may subsequently progresses in the same manner. The etch process may include any method that causes desired etching of layers such as (235) while not detrimentally impacting other layers. Such processes include wet chemical etching or plasma etching as described above. Removal of desired layers (e.g., 235) may also be done with a laser process as described above with step S1170. The laser process may remove a portion or substantially all of the layers exposed by perforation (138). The etch or laser processes may also remove other materials such as bonding agent residues present in the region of perforation (138). The device may be completed to yield a working cell (e.g., FIG. 12E) as described previously above with step S1180.

While the above embodiment describes a carrier selective contact to the base region in opening (320), other methods such as laser doping may be used additionally or separately to create a base contact in the region of opening (320). Such a contact may then be connected to the second metal foil (120) by metallization (325).

While shorting or shunting defects in this embodiment are mitigated by the fact that dielectric (115) is a continuous film until it is patterned to produce opening (320), shorts may still be produced by certain defects. As a finished cell will contain a plurality of patterned openings in the metal foils and on the substrate, it is conceivable that occasional process variations may lead to defects in these opening that could affect factory yield. Two non-limiting examples of shorting defects in the manufacturing process are (type 1) referring back to FIG. 2C, the occasional lack of removal of metal foil (110) to produce opening (130); and (type 2) referring back to FIG. 10B, the occasional lack of removal of conductive structure (240) to produced opening (290). It is contemplated that machine vision can be used to inspect and identify the above defects and their location. In one embodiment, the laser ablation step to produce feature (320) can be directed to avoid laser ablation in the area of the said defects, which may eliminate shorting issues. The machine vision inspection may occur after a foil is bonded to the solar cell. Alternatively, a machine vision inspection may occur during foil manufacture and patterning to identify defects such as (type 1). Information regarding the location of such defects can be incorporated on the metal foil in a machine readable format such that is later use of the metal foil proper correction of the laser ablation pulse locations can be determined.

Figure 13:
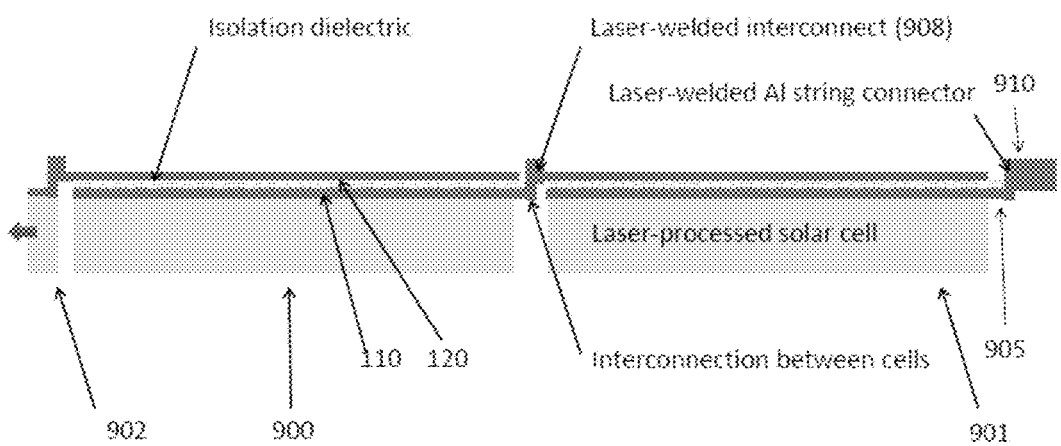
FIG. 13 shows an embodiment relating to cell to cell connection for use in modules.

Incorporation into Modules:

FIG. 13 shows an illustrative embodiment of a solar cell system or solar cells (900, 901, 902) (e.g. Al-foil cell) connected together in series at interconnection (908) (e.g. by laser welding) to form one string in a photovoltaic (PV) module. The cells (900, 901, 902) may be formed by any of the aforementioned process flows. In one embodiment, the connection from one cell to another is a direct connection, meaning a metal foil layer from one cell is electrically connected to a metal foil layer of another cell without intervening wires or other conductive means. In some embodiments, a first metal foil of a first solar cell (900), which is also electrically coupled to the first doping region of the first solar cell, is directly connected to a second metal foil of a second solar cell (901), which is also electrically coupled to second doping regions of the second solar cell. Further, a second metal foil of the first solar cell (900), which is also electrically coupled to second doping regions of the first solar cell, is further connected to a first metal foil of a third solar cell (902), which is also electrically coupled to first doping regions of the third solar cell. In this manner, the cells are connected in series to produce a string of cells. Further, this mechanism of connecting the cells in series allows the cells to be arranged side to side. The positive and negative ends of each string are laser welded to a wire, bar, or sting connector 910 (e.g. Al wire/bar/connector) that electrically connects the strings together. The string connectors 910 run to a junction box where they connect to the external wiring of the PV system. In some embodiments, the Al foils can be welded in series to form a string in a PV module by using ultrasonic welding, micro TIG (tungsten inert gas) welding or soldering using a solder such as tin-zinc alloy (e.g. 91% Sn, 9% Zn).

Referring back to FIG. 13, a multilayer foil assembly rear contact solar cell may have tabs (905) in which one or more of the foils (e.g., 110,120) extend past the edge of the substrate (100) and can serve as a point of electrical connection for the solar cell. The tabs may be integral portions of foils (110,120) without joints between them and the portion of the foils connected to the solar cell substrate. The tabs (905) may extend equal to or greater than 0.5 mm or equal to or greater than 1.0 mm from the edge of the substrate (100). In non-foil contacting approaches, including liquid, vapor, or vacuum deposition techniques, it is difficult to produce tabs (905). Typical contacting with these methods may include a joint of two or more separate entities. The following embodiments describe methods of providing electrical connection between cells in modules in more detail.

Figure 14A:
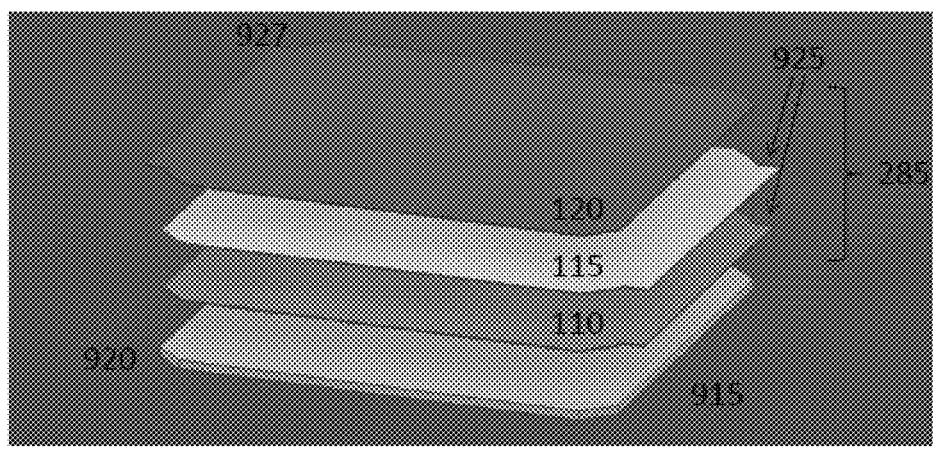
FIGS. 14A-14E show embodiments relating to cell to cell connection for use in modules.
Figure 14B:
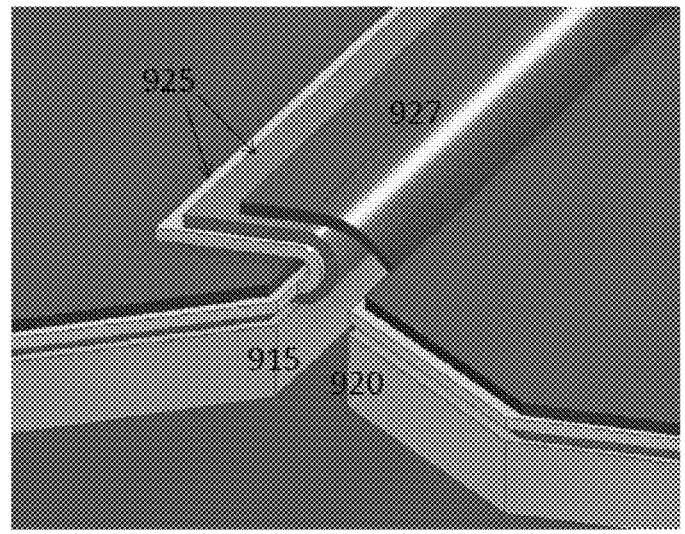

Referring to FIGS. 14A and 14B, in one embodiment cells are connected in a module by folding over a tab on one cell to connect to a tab of the opposite polarity on a second cell. The cells may be formed by any of the aforementioned process flows. Referring to FIG. 14A, a cell is shown in an exploded view to better visualize its features. Each cell has a first edge (915) and a second edge (920), which as labeled correspond to right and left edges. However, it shall be understood by one of ordinary skill in the art these edges may be swapped in other embodiments to provide a reversed arrangement. A generic MFA (285) contains a first metal foil layer (110), a dielectric layer (115), and second metal foil layer (120); however, it shall be understood that other embodiments may provide a different combination of layers including any of the arrangements discussed previously. The first metal foil layer (110) may be connected to a first polarity region of the cell, while the second metal foil layer (120) may be connected to a second polarity region of the cell. The MFA (285) may have tabs (925) corresponding to the first metal foil layer (110) and the dielectric layer (115) extending from the first edge (915) of the solar cell. The second metal foil layer (120) may have a tab (927) extending off the second edge (920). In some embodiments, the second metal foil layer (120) may optionally have a similar tab (not shown) on the first edge (915). Tabs (925) and (927) may be of any desired shape and dimension. They may extend the full width of the cell, or a partial width of the cell. They may be composed on each edge of the cell of several discrete tabs separated by spaces.

A close view of the connection between two cells in this embodiment is shown in FIG. 14B. Tabs (925) of the first metal foil layer (110) and the dielectric layer (115) on the first edge (915) of a first cell may be folded over to expose the first metal foil layer for contacting. Notably, the dielectric layer (115) prevents the first metal foil layer (110) from coming in contact with the second metal foil layer (120) and causing a short. The tab of the second metal foil layer (927) on a second cell may be positioned to make contact with the first metal foil layer of the first cell. The electrical connection at this junction may be secured by any suitable method including soldering, welding, laser welding, and the use of electrically conductive adhesives.

Figure 14C:
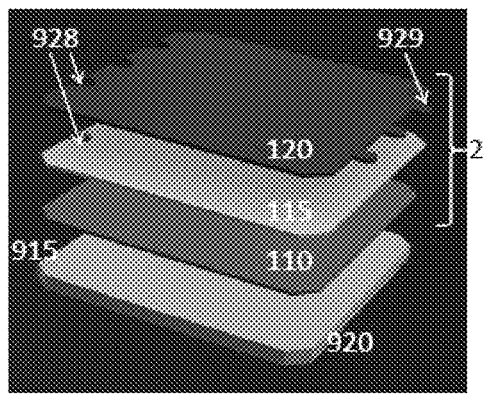
Figure 14D:
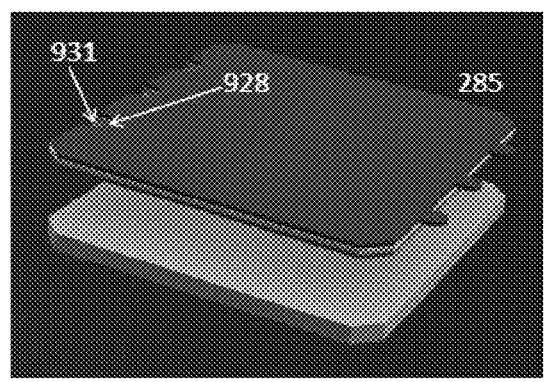
Figure 14E:
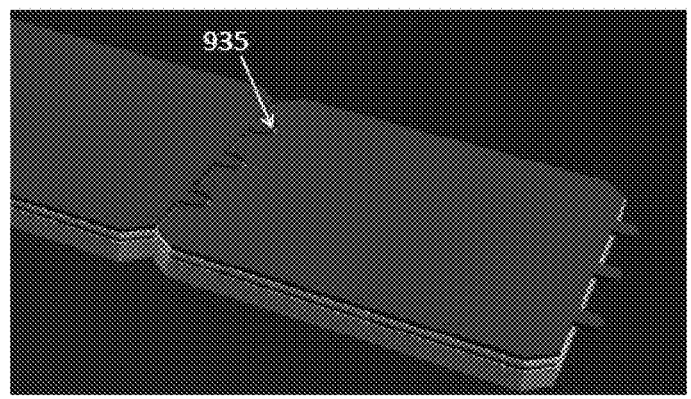

Referring to FIGS. 14C through 14E, in some embodiments cells are connected in a module by producing a tab structure on one cell that mate into a receiving structure on an adjacent cell. The cells may be formed by any of the aforementioned process flows. Referring to FIG. 14C, a cell is shown in an exploded view to better visualize its features. Each cell has a first edge (915) and a second edge (920), which as labeled correspond to left and right edges. However, it shall be understood by one of ordinary skill in the art these edges may be swapped in other embodiments to provide a reversed arrangement. A generic MFA (285) contains a first metal foil layer (110), a dielectric layer (115), and second metal foil layer (120); however, it shall be understood that other embodiments may provide a different combination of layers including any of the arrangements discussed previously. The first metal foil layer (110) may be connected to a first polarity region of the cell, while the second metal foil layer (120) may be connected to a second polarity region of the cell. The MFA (285) may have a cutout or cutouts (928) in the second metal foil layer (120) and the dielectric layer (115) extending into the first edge (915) of the solar cell inward toward the middle of the cell. The second metal foil layer (120) may have a tab or tabs (929) extending from the second edge (920) beyond the substrate. Cutouts (928) and tabs (929) may be of any desired shape and dimension. The only requirement is the shape and dimensions of tabs (929) should be selected to fit within the shape and dimensions of the cutouts (928). The cutouts (928) and tabs (929) may extend the full width of the cell, or a partial width of the cell. Single or multiple cutouts (928) and tabs (929) may be provided as long as the number of cutouts matches the number of tabs. The cutouts (928) and tabs (929) may be spaced apart by any desired length of space. In the nonlimiting examples shown, the tabs and cutouts are spaced apart equally. FIG. 14D shows the collapsed MFA (285). The cutouts (928) of the first metal foil layer and the dielectric layer may be aligned so that when the MFA is assembled, the cutouts expose an area or top surface (931) of the underlying emitter foil or metal layer (110). The dimension of the cutouts (928) in the dielectric layer may be smaller than those in the second metal layer, to prevent any undesired contact from the second metal layer to the first metal layer. Furthermore, the dimensions of the tabs (929) of another cell to be placed adjacent to first edge (915) may also be smaller than the cutouts in the second metal layer to ensure an insulating gap (935) is present when cells are connected in series (FIG. 14E).

At the outer edges of the foils in any of the embodiments of FIGS. 14A-14E, the dielectric layer (115) may extend further than either or both of the first and second metal layers (110, 120) to prevent shorting between the metal layers.

The assembly of multilayer foil solar cells and modules may be combined into one processing line. In a non-limiting example, passivated wafers may be placed by an automated machine onto the front glass plate and/or encapsulation layer of a partially completed module in such a fashion that they may easily be fabricated into cells, tested, and laser welded both in series and in parallel to form an interconnected module.

The multilayer foil assemblies (MFAs) may be fabricated in a high speed roll-to-roll process using lasers to form partial vias in the MFAs, intended for subsequent laser processing to form n+ and p+ point contacts in the passivated wafers. As non-limiting examples, a high speed inkjet or aerosol jet printer may deposit an n+ dopant source in the partial via intended to be laser processed to form the n+ point contacts. As another non-limiting example, Ni(P) (nickel phosphorus, as a n+ dopant source) may be electroplated onto the exposed Al in the bottom of the appropriate partial vias. Contacts may also be formed as carrier selective contacts as discussed in the present invention.

The MFAs may be placed onto each passivated wafer on the front plate of the partially completed module, and laser fired through the appropriate partial vias to form n+ and p+ point contacts. The MFAs may be precut and finished so that the exposed positive and negative tabs on each end of the MFA overlap with the appropriate tab of the adjacent cell, or with an Al conducting bus for parallel connections or connections to the junction box.

An automated testing system may electrically contact each pair of tabs so that the I-V characteristics of each cell as well as the performance of the entire module may be measured before laser welding the tabs to interconnect the module and before laminating the module. In a non-limiting example, if a cell exhibits performance outside the specified limits, it may be replaced by a pretested cell with the correct performance before laser welding the interconnections.

In another non-limiting example, the MFAs may be processed on the passivated wafers and measured before placing them onto the front plate/encapsulation of the partially completed module. In this case, the cells may be binned, and an automated handling system may place cells from the same bin onto the front plate/encapsulation for processing by laser welding to form an interconnected module, followed by lamination.

General Description of Laser Processing:

Laser doping, such as for forming base contacts or the like, may be performed by processes including laser firing, laser doping, laser transfer doping, and/or gas immersion laser doping (GILD). The various laser processing techniques discussed below can be utilized for any of the embodiments discussed herein.

In some embodiments of a laser doping or laser firing process, a dopant source may be applied to the silicon substrate and/or driven into the silicon during the laser pulse while in the laser firing process. In some embodiments of the laser doping or laser firing process, a metal dopant, metal layer, or metal dopant on a metal layer may be applied to the substrate and/or driven into the substrate during a laser pulse. In some embodiments, the dopant layer may be applied by physical vapor deposition techniques, including evaporation and sputtering. In some embodiments, the dopant layer may be applied by chemical vapor deposition techniques. In some embodiments, the dopant layer may also be applied by liquid deposition techniques, including screen printing, squeegee application of a liquid or fluid paste, spin coating, bead coating, electroplating, inkjet, or aerosol jet printing. The liquid dopant can be supplied at a solution or dispersion or slurry.

In some embodiments of the laser transfer doping process, the dopant is supplied from an additional donor substrate. This approach utilizes a rapid interaction between a laser and a non-transparent thin source film deposited on a transparent plate or donor substrate (e.g. glass or quartz), which is placed in close proximity (e.g. about several microns or less) to a substrate. The dopant source may be applied to the donor substrate by any of the approached mentioned above. The donor substrate may also include thin flexible glass and/or polymer films and other materials transparent to the laser radiation.

The donor or transfer substrate of the laser transfer system can be coated with multiple layers depending on the application. As a nonlimiting example, the laser transfer substrate may be first coated with a thin easily evaporated material (e.g. a-Si:H) to act as a release layer for a refractory material (e.g. Mo) or a transparent material (e.g. $SiO_2$) deposited on the a-Si:H. Another example involves first depositing a layer of Ni on the laser transfer substrate followed by a layer of Sb so that the laser will transfer Sb for $n^+$ doping and Ni for a low-resistance nickel silicide contact.

The laser transfer system can utilize multiple pulses in addition to temporally shaped pulses. As a nonlimiting example, the first pulse could comprise a first section of relatively high energy density (e.g. ~1 j/cm$^2$ or greater) over 10 ns, and then a slowly decreasing section where the energy density decreases from equal to or between approximately 0.7 to 0.1 J/cm$^2$ over 400 ns. A second pulse to the same location might then be applied approximately 10 µs later (100 kHz repetition rate) with an energy density ramping up to ~0.3 J/cm² over 10 ns, and then slowly decreasing to 0.05 J/cm² over 500 ns to further anneal the treated region. The wavelength of the laser beam can be in the IR (e.g. 1064 nm) for most applications, but a laser beam operating in the green (532 nm) can also be used and will more effectively heat just the top few μm of an exposed Si surface. The IR beam will initially heat the Si wafer to a depth of a few hundred μm, but as the laser rapidly heats up the Si locally, the absorption coefficient in the IR increases rapidly and the heating becomes localized near the surface region.

In some embodiments, a Gas Immersion Laser Doping (GILD) process may be utilized, where the dopant is supplied in vapor form to a chamber above the substrate such that the dopant vapor is in gaseous communication with the substrate. The gaseous dopant or a byproduct is incorporated into the substrate during the laser pulse. Gaseous source(s) can be any material containing a dopant atom with sufficient volatility, including, but not limited to, $POCl_3$, $PCl_3$, $PH_3$, $BH_3$, $B_2H_6$, arsine, and trimethylaluminum.

The laser process may utilize spatially and temporally shaped laser beams. In some embodiments, the systems or methods discussed herein may have the following elements: (1) supply of dopants by a laser process; (2) dopants supplied by the laser process to avoid heating of the wafers to perform dopant diffusion; and/or (3) a back contact (IBC) cell. The use of line beams is a particularly attractive way to make an IBC cell since the electrodes of the IBC are thin lines, and thus can be patterned with single or reduced number of laser pulse exposures. In some embodiments, the combination of (1)-(3) above may be utilized with line and/or temporal shaping. In some embodiments, the laser beam can be spatially shaped into a narrow line-shaped laser beam or into an array of very small diameter Gaussian laser beams (e.g. <20μm or <10 μm). Line-shaped laser beams with widths <10 μm exhibit little laser-induced damage, while suitable circular Gaussian laser beams (e.g. with diameters of ~30-130 μm) exhibit microcracks and dislocations. Small diameter (<20μm or <10 μm) Gaussian laser beams are also less likely to exhibit extended defects, such as microcracks and dislocations due to the fact that only a very small region of Si is melted and recrystallized.

The temporal pulse shape can be selected for the purposes of laser transfer of material, laser ablation or disruption of dielectric passivation layers, laser melting of selected localized regions of the Si wafer, laser doping of the melted Si regions with the appropriate dopant atoms, laser-induced formation of metal silicides for low-resistance contacts, laser firing of contacting metals through the dielectric passivation layers and/or laser annealing of the localized treated regions on the Si wafer. Generally, laser transfer of material requires relatively short pulses (e.g. few ns to few tens of ns), while laser annealing requires relatively long pulses (e.g. 0.1 μs to several milliseconds). The pulse duration for laser doping will depend on the dopant depth desired and can vary from tens of ns to hundreds of ns. In some embodiments, the dopant penetration depths are equal to or between 0.02 μm to 1 μm, or equal to or between 0.1 μm to 0.5 μm. As a nonlimiting example, a laser process which combines laser transfer, disruption of the dielectric passivation, melting, doping and annealing of the Si in a localized region might employ a line-shaped beam (e.g. 8 μm wide and 1 cm long) with the following temporally shaping: the pulse starts with an energy density of ~1 J/cm² over several ns to transfer the dopant material (e.g. Al) to the substrate (e.g. Si surface) and disrupt the dielectric passivation, if present (e.g. 5 nm of ALD $Al_2O_3$/90 nm of PECVD $SiO_x$ on the rear surface); the energy density then falls to ~0.5 J/cm² over ~50 ns to locally melt the substrate surface and diffuse in the dopant; and then the pulse energy density decreases from 0.5 to 0.1 J/cm² over ~400 ns to anneal the localized region of substrate surface.

As nonlimiting examples, dopant materials may be any suitable n- or p-type material, Al, Sb, Group III or V element, or the like. In the laser transfer process, the dopant atom is introduced on a donor substrate containing or coated with a dopant material including the donor atom. In a laser firing or doping process, the similar dopant is included as a metal or dopant material, respectively, on the substrate to be fired. The dopant material may be a pure form of the dopant, such as but not limited to coatings of the group III or group V atoms. Alternatively, the dopant material may be a compound containing the dopant, such as but not limited to an oxide, nitride, or chalcogenide of the donor. The dopant material may also be composed of an alloy or a host material containing the dopant, such as hydrogenated amorphous silicon heavily doped with the dopant. Concentration of the dopant in the host material may be equal to or greater than 0.5%, or equal to or greater than 2%.

Any substance capable of producing low specific contact resistance contacts to silicon or other semiconductors may be utilized. Various metals may be incorporated at or near the silicon surface to produce low contact resistance. These metals may include nickel, palladium, titanium, platinum, molybdenum, tungsten, or the like. The metals may be supplied as deposited coatings on the silicon substrate or on a foil assembly that is being applied to the substrate. The substance may be supplied as an ink containing the metal, either in the form of a chemical precursor to the metal, particles of the metal, or particles of a compound containing the metal. Particularly useful particles include silicon compounds of the metal, such as silicides.

Figure 15A:
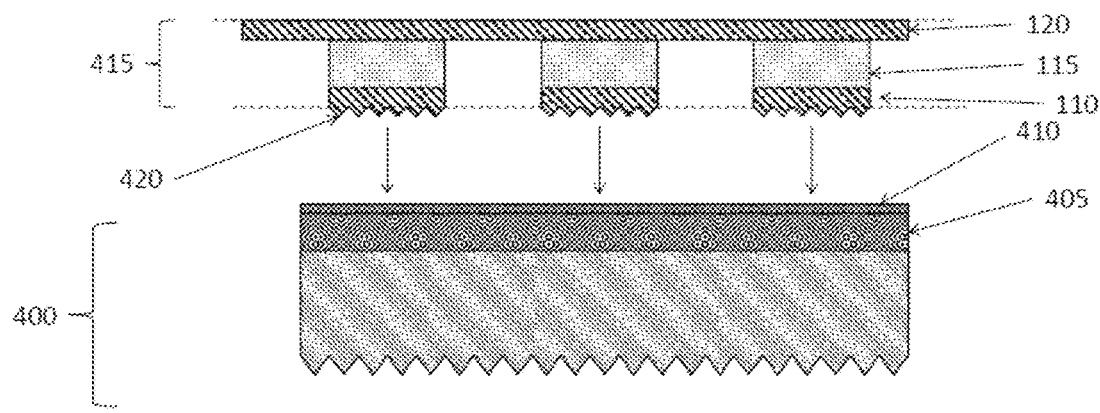
FIGS. 15A-15B show cross-section views of illustrative embodiments of partially assembled solar cells.

General Bonding and Conductive Bonding:

The various bonding techniques discussed below can be utilized for any of the embodiments discussed herein. An example of general bonding, bonding layer(s) serves to bond two discrete layers together to achieve a mechanical and/or electrical connection. Referring to FIG. 15A, a general substrate (400) is shown with general rear surface layers (405). It is understood that the general substrate (400) may include any of the features of the substrates of this invention including but not limiting to textures, doping, processing, and is only a simplified representation of the substrate. It is understood that the rear surface layers (405) may include any of the features of the rear surface layers of this invention, and may include emitter forming layers, emitter contacting layers, base contacting layers, and may also be patterned in any useful way although represented for simplicity as a continuous layer. A bonding agent (410) may be present on the rear surface of the general substrate (400). A general multilayer foil (415) may be presented to the substrate for attachment. It is understood that the general multilayer foil (415) may be representative of any of the multilayer foil assemblies of this invention, including those exemplified by FIGS. 2A-2D.

The bonding layer may include an adhesive, such as a pressure sensitive adhesive. Nonlimiting examples of pressure sensitive adhesives may include acrylics, rubbers, ethylene-vinyl acetates, nitriles, silicones, or styrene block copolymers. The adhesive layer can be applied at various stages of production, including during the formation of the foil film or during the solar cell fabrication process. Surfaces on which the pressure sensitive adhesive exist or attach to may be treated to promote adhesion. Nonlimiting examples of such treatments may include cleaning, solvent cleaning, chemical treatment, ozone treatment, corona discharge, and/or plasma treatments.

In some embodiments, the bonding layer may be or may include a curing adhesive that acts to bond the surfaces. A curing adhesive is an adhesive that has low tack or is liquid in its native state, but is then in modified to produce adhesive behavior before, during, or after the substrates to be bonded are attached. The curing adhesive can be cured by any suitable technique including exposure to heat, moisture, activating compounds, and/or light. Nonlimiting examples of curing adhesives include acrylics, polyesters, urethanes, polyol-urethanes, epoxies, polyimides, and cyanoacrylates.

In some embodiments, the bonding layer may be or may include adhesive polymers in which bonding is achieved by exposing the joined surfaces to temperatures sufficient to allow the polymer to flow or melt. Nonlimiting examples of such polymers include polyvinyl alcohols, polyvinylbutyrals and ethylene-vinyl acetates. In some embodiments, the bonding layer may be or may include laminating adhesives, including, but not limited to, polyurethanes.

The bonding layer may be applied by any suitable process. Nonlimiting examples of such application processes include bead coating, spray coating, aerosol vapor coating, and extrusion. In some embodiments, the bonding layer may be applied in a patterned fashion so as to be only present in certain locations. Nonlimiting examples of patterning application methods include inkjet printing, gravure printing, and screen printing.

The bonding layer can have any thickness suitable to achieve useful adhesion. As a nonlimiting example, the bonding layer thickness may be in the range of equal to or between 1 to 50 microns, or equal to or between 3 to 30 microns. The bonding action may be aided by mechanical pressure applied to form the bond. Nonlimiting examples of suitable mechanical pressure may include pressure applied by rollers, uniform pressure applied by a plate or mold, and air pressure.

Conductive bonding is a variation of bonding in which, in addition to a mechanical bond, the surfaces being joined together achieve suitable electrical contact. In some embodiments, electrical contact may include a specific resistance between layers of equal to or less than 1 ohm-cm$^2$, or equal to or less than 0.2 ohm-cm$^2$.

In some embodiments, conductive bonding layers may exist on one or both of the surfaces to be placed in contact for bonding. The conductive bonding layer may comprise any of the material described for general bonding with the incorporation of a conductive material. Nonlimiting example of suitable conductive materials may include metal particles, carbon particles, and/or semiconductor particles. In some embodiments, conductive particles may be equal to or less than 30 microns in effective circular diameter, or equal to or less than 10 microns in effective circular diameter. In some embodiments, the bonding layer may comprise metal particles in an adhesive matrix, where the metal particles include silver, copper, nickel, or the like. In yet another embodiment, the bonding layer may comprise graphite particles in an adhesive matrix.

The conductive bonding layer may include a metal or alloy that produces electrical contact through methods including heating and/or pressure. Nonlimiting examples of suitably metals or alloys may include indium, solders, and/or tin. Metals include metals or alloys that melt at equal to or less than 350 C, or equal to or less than 300 C. Tin-zinc alloys may be used to solder aluminum to aluminum or copper at relatively low temperatures (e.g. equal to or between 200° C. to 260° C.). In some embodiments, surface treatment agents such as flux may be used to improve metal adhesion and wetting.

Figure 15B:
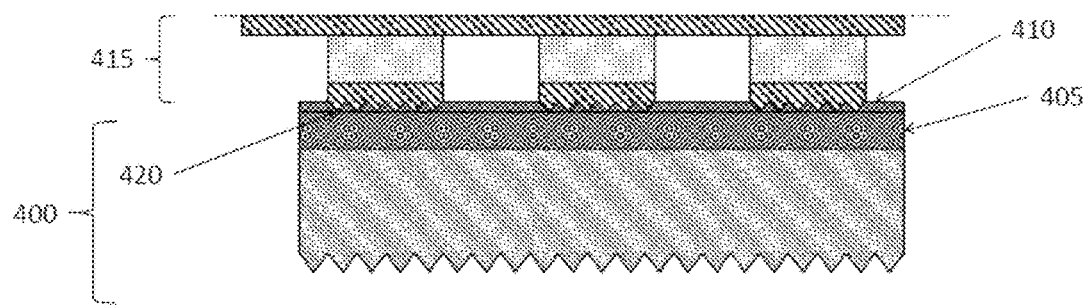

Referring to back to FIG. 15A, a surface of a metal foil (110) may provide a texture (420) that allows for improved electrical connection using a bonding layer (410). Referring to FIG. 15B, when metal foil assembly (415) is brought in contact with substrate (400), texture (420) may allow penetration of the metal through the bonding layer (410) to produce good contact to the rear layers (405). In some embodiments, the metal foil texture (420) may include textures formed by chemical etching and mechanical abrasion. In some embodiments, the texture (420) may be formed by an embossing process. In some embodiments, the substrate surface at layer (405) or rear of substrate (400) may be textured and may be joined with a metal foil (110) with or without a texture. In some embodiments, this texturing may be achieved by depositing a conductive material on the substrate or the foil to form protrusions on the surface. The features of the texture may be equal to or less than 0.5 mm in diameter and/or height, or equal to or less than 0.1 mm in diameter and/or height.

Bonding or conductive bonding layers may be coated uniformly on the surfaces of a metal foil or metal foil assembly. Alternatively, bonding layers may be patterned for reasons including minimizing the usage of the bonding material or preventing unnecessary shunting or electrical conduction.

In some embodiments, the same bonding agent may be used for conductive bonding of both the emitter and the base contact. As a result, in some embodiments, the conductive bonding layer may have a composition such that it exhibits high conductivity in a vertical direction through the film, but a low conductivity in lateral direction through the film. Conductive bonding layers for this application may include anisotropic conductive films or anisotropic conductive adhesives.

Foil Patterning:

A metal foil assembly may be patterned by any suitable method. In some embodiments, the metal foil assembly may be patterned in a roll-to-roll process, or as sheet stock in a batch process. The patterning process may include laser ablation or laser cutting, mechanical patterning such as perforation, dry phase patterning and/or chemical processes such as etching. The laser processing may include using a laser with a short pulse, such as a laser with a pulse length equal to or less than 100 ns, or equal to or less than 1 ns. Dry phase pattering may use a groove pattern on a wheel or plate to press a relief pattern on a material that may include multiple layers. A milling wheel then mechanically removes portions of the protruding pattern. This method can independently pattern a subset of the layers from an existing multilayer foil assembly.

Figure 16A:
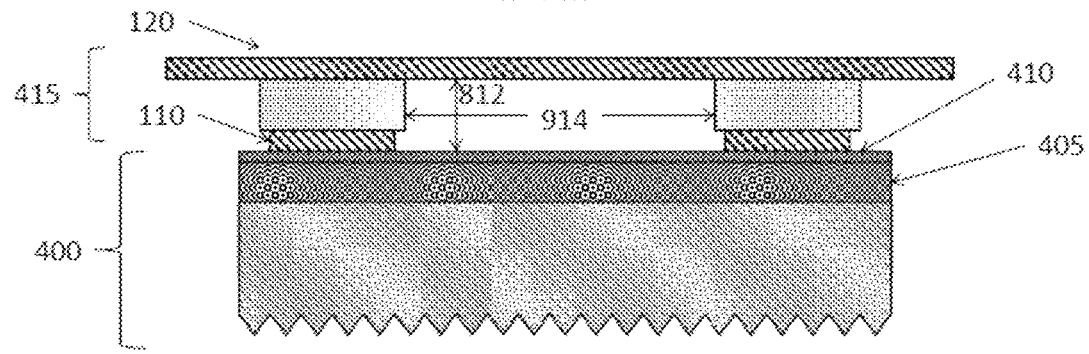
FIGS. 16A-16B show cross-section views of illustrative embodiments of partially assembled solar cells.

Foil Application Processes:

Referring to a nonlimiting example in FIG. 16A, a general multilayer foil structure (e.g. 415) may be applied to a surface of substrate (e.g. 400). The multilayer foil structure may be created by any of the methods discussed herein, including application of one or more multilayer foil assemblies and/or application of individual foil elements. In some embodiments, a gap (e.g. 812) may exist between the substrate (e.g. 400) and the second foil (e.g. 120), and improved contact between the substrate and the foil may be obtained if foil (120) approaches the substrate. The gap may exist near a general opening (914) in the multilayer foil assembly, where the general opening is an opening made by any of the methods described above and is for at least the purpose of allowing contact of the upper foil (120) to the substrate.

Figure 16B:
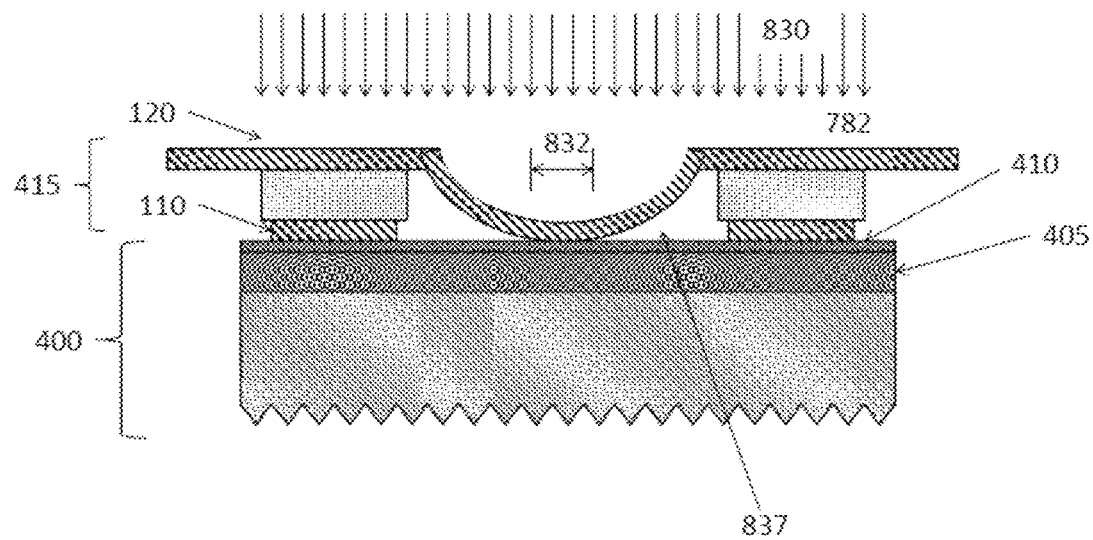

In another embodiment (FIG. 16B), a predetermined force (830) may be used to cause the second foil (120) to approach and contact the substrate by locally deforming (837) the second foil. With sufficient bonding force or pressure (830) a contact region (832) can form between the second foil (120) and a region of the substrate where may exist, for example, a carrier selective base contact. In other embodiments, a similar deformation mechanism may be used to cause of the approach of a different layer of the multilayer foil, as exemplified by FIGS. 2D and 12C. It is understood that the same mechanisms such as force or pressure (830) may be used in these analogous cases.

In some embodiments, a conductive bonding layer, such as a conductive adhesive or solder, may be present on one or more of the foil elements such than when the bonding force or pressure (830) is applied conductive contact is made between the second foil (120) and the substrate. In some embodiments, an additional activation step for the conductive bonding layer as previously described above may be applied during or near the timeframe of the application of force or pressure (830), such as a curing step to activate and bond the conductive adhesive or to melt solder. In the case of solder, a fluxing agent may be applied locally to form a low resistance adherent bond.

In some embodiments, the specified force (830) may be mechanical pressure, such as a roller, compliant plate, press or the like. In some embodiments, the specified force (830) may be a gas pressure. As a nonlimiting example, gas pressure can be accomplished by applying a membrane or a foil over the sample and producing a vacuum under the membrane or foil. This may allow pressures up to one atmosphere to act on the sample. In some embodiments, pressures greater than 1 atmosphere can be applied from above the sample alone or in conjunction with other methods discussed herein. In some embodiments, an array of gas jets may be used to apply pressure or additional pressure from above the sample. In some embodiments, total pressure on the sample by any method may be in the range equal to or between 0.25 to 20 atmospheres, or in the range equal to or between 0.5 to 10 atmospheres. In some embodiments, a laser beam may be used to locally heat the foil (120) so that it causes the foil to locally deform (837). The laser beam can heat foil near its melting point so that the foil locally sags into the central region of the opening (914).

In some embodiments, the second foil (120) may be embossed or patterned in a way to provide elasticity to allow facile deformation (837), such as depicted in FIG. 15A as a nonlimiting example. Embossing may include, but is not limited to, ridges, protrusions, and other patterns that allow deformation as they flatten out. The foil may also include perforations, such as linear perforations or slits, that allow deformation as they open up. The foil may be patterned with so called Eggbox or Miura motifs to allow expandability. The period of the motif may be equal to or less than 1000 microns, or equal to or less than 200 microns. The formation of deformation (837) may occur once part or all of the metal foil assembly is in place on the substrate. In some embodiments, part or all of the deformation (837) may occur during fabrication of the multilayer foil assembly prior to bonding to the substrate, when the multilayer foil assembly is in roll or sheet form. It may also occur as a separate process step once the multilayer foil assembly is singulated, but prior to bonding to the substrate.

Metal foils or metal foil assemblies may be fabricated, shipped, and supplied in forms including, but not limited to, wide roll form, slit roll form, sheet form, or singulated. Equipment for the bonding process may include slitting and chopping equipment to take roll or sheet form and produce metal foil assemblies appropriate for a single solar cell. These operations may take place prior to or after bonding of the foil to the solar cell.

Foil Dielectrics:

The foil dielectric (115) may comprise any material with low or negligible conductivity. Such materials may be inorganic materials including $SiO_2$, $Al_2O_3$, $SiN_x$. The inorganic materials may be applied by liquid coating, sintering, vacuum coating, anodization, or the like.

In some embodiments, the materials may be polymer films. Polymer films may be applied by solvent coating or casting, or by adhesion of preformed polymer films or webs to other functional layers, such as metal foils.

Nonlimiting examples of polymers suitable for solvent casting include acrylics including polymethylmethacrylate (PMMA) and polyethylmethacrylate, polyvinylbutyrals, polyethylenevinylacetate (EVA), poly(vinylchloride) (PVC), poly(cyanoacrylate), and cellulosics including nitrocellulose and cellulose triacetate.

In some embodiments, the dielectric may be equal to or between 2 to 150 microns thick, or equal to or between 6 to 40 microns thick.

Nonlimiting examples of polymers suitable for being employed as preformed films that may serve as dielectric layers include polyesters including polyethylene terephthalate (PET) and polyethylene napthalate (PEN), polypropylene, polycarbonate, polyimide, polyvinylidene chloride, polyvinylidene fluoride, and polyvinyl chloride. The films may be treated to improve adhesion, including corona, flame, priming, solution or vapor chemical, and plasma surface pre-treatments.

The polymer films may be treated or manufactured to provide improved properties including strength and dimensional stability. Nonlimiting examples of treatments include uniaxial orientation, biaxial orientation, and anneals to improve dimensional stability and core set.

Uniaxial and biaxial orientation of the polymer films may be achieved during manufacture of the film prior to incorporation into a multilayer foil assembly. Other conventional methods of creating a multilayer structure, such as sequential deposition on a substrate of metal and dielectric layers, cannot provide the desired film orientation in the polymer film because significant film orientation cannot be achieved with alternate deposition methods such as vapor deposition, spray deposition, or solution casting. These other methods thus cannot provide the desirable properties such as strength associated with an oriented film.

In some embodiments, the degree of orientation of the polymer film can be represented by a planar orientation coefficient, $\Delta p$, in accordance with the equation:

$$\Delta p = \frac{n_1 + n_2}{2} - n_3$$

in which:
$n_1$ is the refractive index in the main direction of orientation in the plane of the film;
$n_2$ is the refractive index in a direction perpendicular to the main direction of orientation, in the plane of the film;

and $n_3$ is the refractive index in a direction perpendicular to the plane of the film.

The refractive indices may be measured by any suitable method, and may be measured at any wavelength, preferably at the yellow line of sodium ($\lambda$=590 nm). A value of $\Delta p$=0 would indicate no orientation of the polymer film. In some embodiments, the degree of orientation of the polymer film serving as the dielectric layer may be greater than 0.08, preferably greater than 0.1.

In some embodiments, foil dielectrics may be transparent. Alternatively, the foil dielectric may include a colorant to allow it to absorb laser radiation and thus increase the efficacy of laser based machining, modification, and ablation processes. Colorants may include dyes and pigments. In some embodiments, the dyes and pigments may have absorption at 1064 nm, 532 nm or 355 nm. In some embodiments, the colorant may be carbon black in micro- or nano-particle form.

In some embodiments, the first metal foil (110) is contiguous over a portion of the solar cell with openings (914). In some embodiments, the fraction of area represented by the openings in the first metal foil (110) in a region may be equal or less than 40% of the total area covered by the foil, equal to or less than 25%, or equal to or less than 20%. The plane aspect ratio of an opening (130) can be defined as the ratio of the largest width of the opening to the length of the opening in a direction perpendicular to that of the largest width. For example, in reference to FIG. 1, the plane aspect ratio for opening (130) can be viewed as a ratio of the length and width of the shape of said opening, which may be a circle, oval, square, rectangle, or any other suitable shape. The plane aspect ratio of the openings (130) may be equal to or less than 10:1, or equal to or less than 5:1. The vertical aspect ratio of opening (130) may be defined as the ratio of the largest width of the opening in the plane of the foil to the vertical height of the foil or foil assembly. The vertical aspect ratio of the openings (130) may be equal to or greater than 2:1, or equal to or greater than 5:1.

In some embodiments, the first metal (110) and second metal (120) layers may have a thickness in the range equal to or between 2 to 100 microns, which may be difficult to achieve with vapor deposition techniques. In some embodiments, the thickness of the two metal layers may be equal to or between 6 to 70 microns. In some embodiments, the metal layers may be composed of aluminum, equal to or greater than 60% aluminum, or equal to or greater than 80% aluminum. In some embodiments, the foils may have different textures on each face of a foil. In the manufacturing process of foils, a bright finish may be produced when the foil comes in contact with a work roller surface. A matte finish may be produced when two sheets are rolled simultaneously, with the sides that are touching yielding a matte finish. Other mechanical finishing methods can be used to produce patterns.

Aluminum foils may contain defects typical of their fabrication including dislocations such as dislocation slip defects and dislocation glide defects. Vapor deposition of aluminum may have substantially fewer defects. Solution deposition of aluminum may show a local porosity consistent with sintering of metal particles.

A non-limiting example focusing on the base contact region in which the second foil (120, see FIG. 10C), or a dielectric layer (115, see FIG. 12C) make contact to the substrate is discussed herein. The foil or dielectric layers are locally deformed to allow the foil or layers to approach the substrate, which may be achieved utilizing any of the methods discussed above or a combination thereof. With sufficient bonding force or pressure (830) a contact region (832) can form. Because of surface roughness and other considerations, the second foil (FIG. 10C) or the dielectric layer (FIG. 12C) may not make continuous contact in the contact region (832). Contact may be considered as regions in which a foil or dielectric layer is within 5 microns or less from the surface of the substrate. Considering the area of the contact region (832) in relation to the total area of opening (914), the contact area may be equal to or between 5% and 80% of the opening area, or between 10% and 50% of the opening area.

In some embodiments, there may be a void area (912) that is unfilled by any solid or liquid material. In some embodiments, an area or volume near a metal foil contact (e.g. as shown in FIG. 10C or 12C) may contain void areas (912) due to the fact that the original foil has stiffness and other mechanical properties that prevent it from conformally and substantially filling opening (914). In some embodiments, the void area may exist between the second metal foil and the substrate. Further, in some case, the void area may prevent second foil (120) from contact with other layers of the MFA (270), such as the dielectric layer, and more importantly, first foil (110). This prevents shunting contact between the second foil (120) and first foil (110). In non-foil contacting approaches, including liquid, vapor, or vacuum deposition techniques, it is difficult to form such large voids desirable to prevent such shunting issues. The size of a void (912) may be characterized by its volume or by its projected area in cross section, such as from the view shown in FIG. 10C or 12C. The cross section may be taken so that it intersects the center of opening (914). In some embodiments, the void projected area for a single base contact of the current foil based device may be equal to or between 50 $\mu m^2$ to 20,000 $\mu m^2$, or equal to or between 100 $\mu m^2$ to 15,000 $\mu m^2$. In a similar structure with metal applied by other deposition techniques not using foils, the void projected area may be equal to or less than 20 $\mu m^2$, or equal to or less than 10 $\mu m^2$. Alternatively, the total volume of void (912) associated with a single base contact area may be characterized. Any suitable technique may be used to measure the total volume of void. In some embodiments, the void volume for a solar cell utilizing the design(s) discussed herein may be equal to or between $3 \times 10^4$ $\mu m^3$ to $2 \times 10^7$ $\mu m^3$. In a similar structure with metal applied by other deposition techniques not using foils, the void volume associated with a single contact may be equal to or less than 5000 $\mu m^3$, or equal to or less than 2000 $\mu m^3$. The amount of void may also be expressed as a fraction equal to the total volume of void (912) divided by the total volume of the opening (914). In some embodiments, void volume fractions might be in the range of 3% to 40%. In contrast, a similar structure with metal applied by other deposition techniques not using foils may have a void fraction of <0.5%.

In some embodiments, a solar cell may include a combination of one or more any of the features described below.
- A carrier selective base contact on a solar cell formed by a laser transfer process
- MFA based metallization with base and/or emitter contacts that are carrier selective contacts
- A module composed of solar cells with an MFA based metallization, where adjacent cells are electrically connected by folding over tabs on a first edge of a first cell to expose a first metal layer and connecting to a tab of the second metal layer on a second cell.
- A module composed of solar cells with an MFA based metallization, where adjacent cells are electrically connected by having cutouts on a first edge of a first cell that expose the first metal layer, and having tabs of a second metal layer extending beyond the substrate of a second cell that contact the first metal layer of the first cell.

An all back contact solar cell comprising:
  a substrate, wherein a back surface of the substrate contains a passivation layer;
  a multilayer foil assembly (MFA) coupled to the back surface of the substrate, wherein the MFA comprises
    a first metal layer,
    a dielectric layer, and/or
    a second metal layer
      wherein the dielectric layer is sandwiched in between the first metal layer and the second metal
  a base contact region on the back of the substrate aligned with openings in the first metal layer, dielectric layer, and second metal layer, wherein the opening in the dielectric layer is smaller than the opening in the first metal layer
  An additional conductive metal that touches the dielectric layer and connects the substrate base region to the second metal layer The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Example 1 Bilayer Cells with Bilayer Foil

More advanced cells employing Al foil contacts for both the emitter and base connection are.
  n+ Contacts with Phosphorus-Treated Aluminum Foil:
  Since our SHJ structures were made on n-type Si, n+ base contacts to our top Al foil were required. However, since Al is a p-type dopant, laser firing of an Al foil would produce an undesirable p-n junction. To address this problem, a method to produce n+ contacts using Al foils with a specialized phosphorus treatment was developed.

To demonstrate, a test structure was built on 150 μm thick n-type Si (resistivity ~1.5 Ω-cm) with a low resistance n+ front contact. An Al foil with a phosphorus-containing dopant layer was laser fired to the rear by applying laser pulses while the foil was held in contact to the substrate. The laser pulses melt and penetrate the Al, creating an n+ contact to the Si. Due to a limitation of laser power, we used a matrix pulse layout so that each "point" contact was actually composed of a 3×3 array of closely spaced laser fired spots that span a dimension of ~100 μm. The laser fired contacts were made using 600 ns pulses at a wavelength of 1064 nm, with a beam diameter of ~35 μm. The point contacts were spaced on a 1 mm square pitch.

Figure 17A:
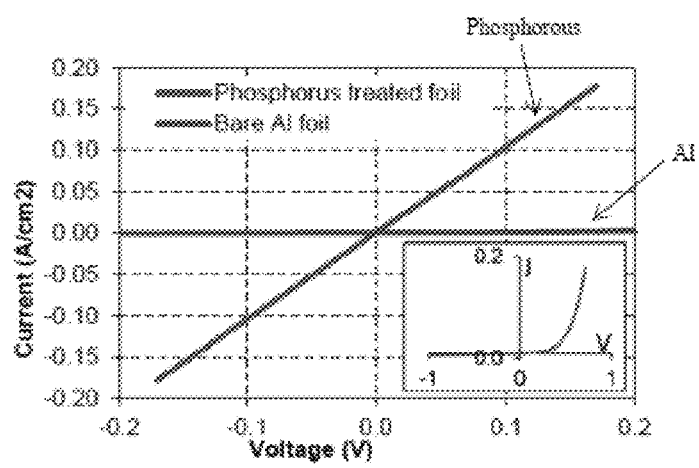
FIGS. 17A-17B respectively show (a) I-V characteristics of Al foil contacts to n-type silicon showing the effect of the phosphorus foil treatment (Inset: Larger voltage sweep showing diode behavior for bare Al foil) and (b) I-V characteristics of a full bilayer foil cell including single diode fit (Inset: Cell rear showing emitter foil (e) and base foil (b))

FIG. 17A shows I-V characteristics of Al foil contacts to n-type silicon showing the effect of the phosphorus foil treatment, and The inset shows a larger voltage sweep showing diode behavior for bare Al foil. When a bare Al foil was used (flat curve), current flow over the low voltage range was small, and it is clear that the device exhibited diode behavior when swept over a larger current range (inset). This is consistent with formation of a p-n junction due to the polarity of the Al dopant.

A phosphorus-treated foil, made by coating and annealing a phosphorus dopant on the surface of the foil, yielded a very different and ohmic behavior (sloping curve). The slope of the line indicates an effective resistance of 0.95 ohm-cm$^2$. Assuming that resistance contributions due to the silicon bulk and the front contact are negligible, this value converts to 95Ω per point contact, a value not far above the spreading resistance limit for a point of this size (100 μm), calculated to be 70Ω. It is concluded that effective contacts can be made by laser firing of the dopant-treated foils, forming the basis for facile construction of bilayer foil cells discussed further herein.

The ability to produce n+ doping with a treated Al foil is surprising considering the abundance of Al present during the laser firing process. Similar behavior was noted when the dopant is applied to the Si substrate instead of the foil.

Bilayer Foil Cells:
Bilayer foil cells were fabricated in a similar process to the emitter foil only cells (see discussion of Bilayer Cells with Emitter Foil Only). However, after self-aligned etching of the TCO/Ag layers, a phosphorus-treated Al foil was pressed onto the cell using a custom press that dimples the Al foil in order to allow contact with the Si substrate (e.g. FIG. 2B). At this point, laser contacts are made by laser firing through the back of the foil to produce n+ contacts as described above. This structure does not require a secondary insulator, as the base foil would have to deform extensively in order to make any contact with the emitter foil.

Figure 17B:
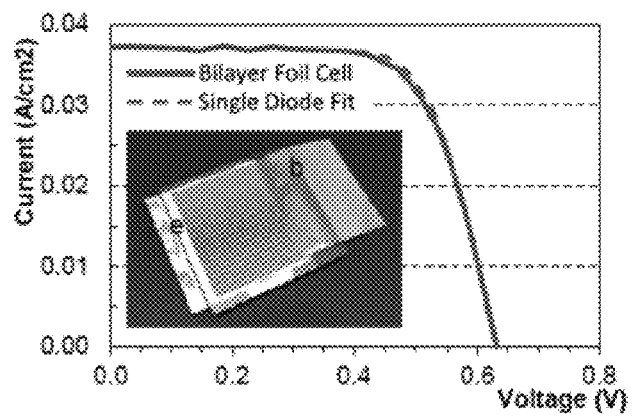

Bilayer Foil Cell Results:
The one-sun I-V characteristic of the bilayer foil cell is shown in FIG. 17B (solid curve), along with a photograph of the cell (inset) showing the emitter (e) and base (b) foils. The cell yields an efficiency of 16.3%, with $V_{oc}$=0.632 V, $J_{sc}$=37.2 mA/cm$^2$, and fill factor=69.2%. The reduction in $V_{oc}$ and $J_{sc}$ relative to the cells with an evaporated Al base layer likely results from increased laser damage due to non-optimal pulses for producing the laser-fired foil contacts. In particular, the reduced $J_{sc}$ may arise from electrical shadowing in regions above the base contacts.

FIG. 17B includes a single diode fit (dotted curve) to the I-V curve of the bilayer foil cell, from which a series resistance of ~2.0 ohm-cm$^2$ was extracted. From the foil contact results of the preceding section, a foil contact contribution of about 0.95 ohm-cm$^2$ is expected.

Example 2: Bilayer Cells with Carrier Selective Contacts (e.g. By Oxidation of a Titanium Layer[FC004])

Solar grade n-type silicon wafers with a bulk resistivity of approximately 1.5 ohm-cm were etched in 20% KOH at 80° C. to yield ~150 μm thick samples with a shiny etch surface on both sides. These samples were further treated with a solution of 5 parts of buffered oxide etch (6:1) and 95 parts of water to remove native oxide and yield a dewetting surface. Immediately following this treatment, 0.5 nm of titanium was deposited onto the samples by thermal evaporation at a deposition rate of approximately 0.01 nm/s. The sample was removed from the deposition chamber and heated in air at 95° C. for three minutes, then held in room air for several hours. The air exposure serves to transform the thin Ti layer into $TiO_2$. The resulting samples were metallized with 400 nm of aluminum using thermal evaporation.

A transfer length method (TLM) structure was created by photolithographic processing of the above samples, to yield contact pad pairs of 10 mm width separated by gaps ranging from 9 µm to 38.5 µm. Resistance between pairs of pads was determined with using a 4-wire current/voltage measurement with 10 mA as the probe current, followed by analysis to extract the specific contact resistance. Additionally, a current voltage sweep was done across the pair at pads at 9 µm separation in order to examine linearity of the I-V characteristic.

Figure 18A:
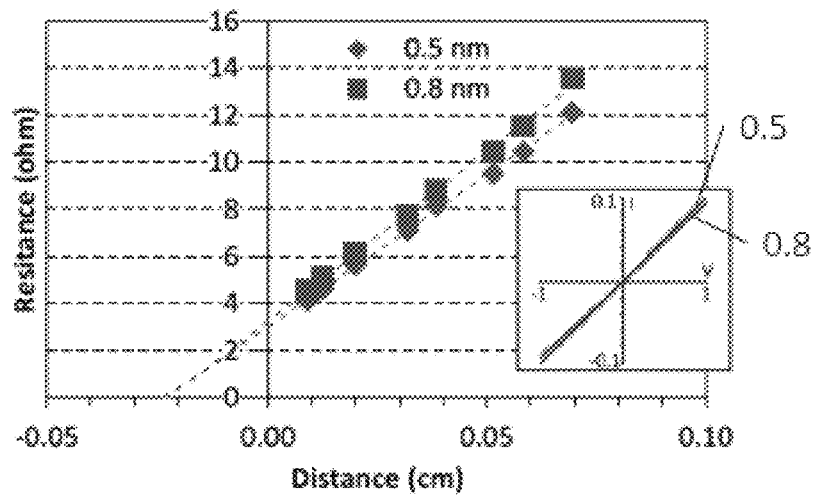
FIGS. 18A-18B respectively show (a) TLM plot for a test structure showing results for a 0.5 nm and (b) a 0.8 nm $TiO_2$ layer (inset: I-V characteristics of both samples measured across the 9 μm gap) and I-V characteristics of multilayer foil cell employing a $TiO_2$ carrier selective base contact.

FIG. 18A shows results of the TLM measurement for the two $TiO_2$ thicknesses (0.5 nm and 0.8 nm), with an inset showing the I-V characteristics of both samples measure across the 9 µm gap. The resistance between contacts in the TLM test is well behaved, as evidenced by an acceptable linear fit to the measured resistance as a function of gap distance. Further, the I-V characteristic is nicely linear over the range of the measurement, indicative of ohmic contact to the silicon. In this geometry, a contact to the silicon made without the intervening carrier selective $TiO_2$ would be highly non-linear with low current flow.

A specific contact resistance of 0.018 ohm-$cm^2$ was obtained from the TLM analysis. Furthermore, the I-V sweep between the pads at 9 µm separation shows a linear behavior. Both pieces of data indicate the formation of an ohmic contact. In this geometry, a contact to the silicon made without the intervening carrier selective TiO2 would be highly non-linear with low current flow.

Carrier Selective Cells:

The carrier selective cell process was identical to that of the bilayer cells with emitter only foil (discussed further below) through the deposition of the secondary insulator. The secondary insulator was patterned photolithographically to open vias in the center of each foil perforation. The circular vias had a diameter of approximately 100 µm. The sample was then exposed to 25% TMAH in water at 88° C. for 90 seconds in order to remove the amorphous silicon layers exposed in the via. A special holder was used in order to avoid contact of the TMAH solution to the front of the sample which can damage that area.

The rear of the sample was exposed to a solution of 5 parts of buffered oxide etch (6:1) and 95 parts of water to remove any native oxide on the newly exposed silicon, followed by $TiO_2$ deposition of approximately 0.8 nm. A base contact of aluminum was then deposited as done for the bilayer cells with emitter only foil (discussed further below).

Figure 18B:
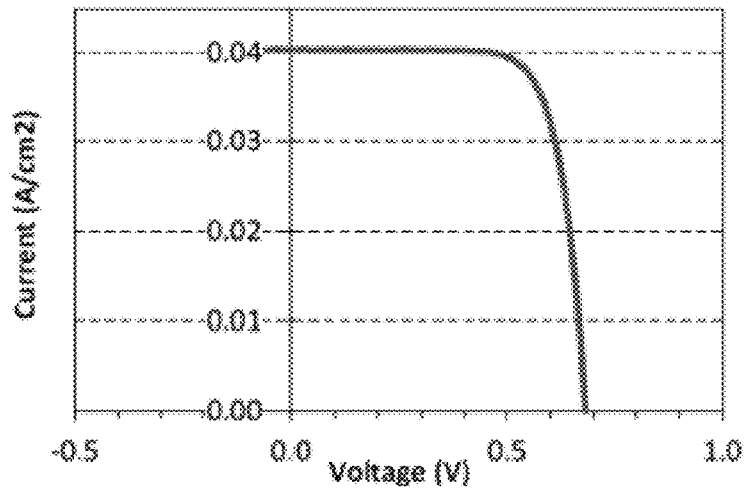

The one-sun I-V characteristic of the carrier selective cell was measured at the NanoPower Lab of the Rochester Institute of Technology (RIT) and is shown in FIG. 18B. The best performing cell with this fabrication process yields an efficiency of 20.7%, with $V_{oc}$=0.681 V, $I_{sc}$=40.4 mA/$cm^2$, and Fill Factor=75.2%.

The carrier selective cell, while similar in structure to the laser fired bilayer cells with emitter only foil (discussed further below), shows mainly improvements in $V_{oc}$ and Fill Factor. The improvement in $V_{oc}$ is likely due to reduced damage of the carrier selective contact relative to the base contact produced by laser firing. Interestingly, the fill factor is also improved even though the carrier selective contacts have a similar dimension to the overall outline of the earlier laser fired contacts. Without being bound by theory, it is hypothesize that with reduced damage and increased charge carrier lifetime, the cell benefits from increased levels of injection, which in turn aids in the majority carrier conduction to the base contacts.

Module Design Implications:

The multilayer foil approach lends itself to simplified modes of module manufacture. In typical front emitter cells, additional conductors in the form of tabbing are required to connect cells, leading to cost and fabrication complexity. Alternatively, typical back contact cells can be connected directly to each other, or using a conductive circuitized backplane. Direct connection requires low resistance of the cell metallization, and may be addressed by increased metallization or restriction to smaller cell sizes. The use of a circuitized backplane reduces this restriction, but at the expense of additional components in the module.

The bilayer foil approach, by virtue of the use of full metal layers for both emitter and base connections, can achieve low cell resistivity. Furthermore, the foils themselves can serve as a low cost cell interconnection method.

Figure 19:
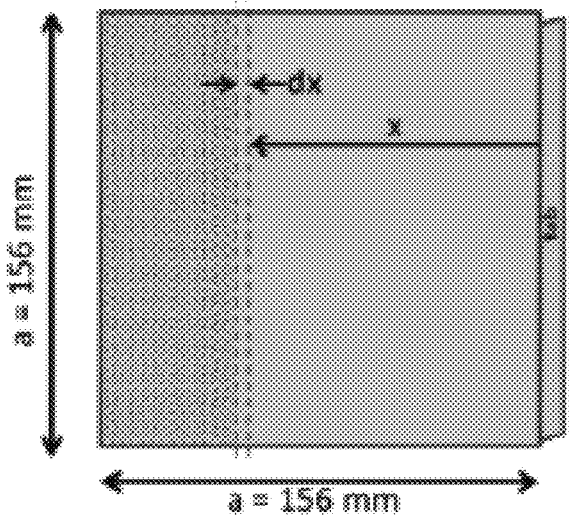
FIG. 19 shows parameters for current flow in foil layers.

Foil Resistance Contributions in Cell:

Power loss expected from resistance in the foil of a full area cell can be estimated by assuming that current flows uniformly into the foil, and studying the power loss of a segment dx of the foil as shown in FIG. 19, which shows parameters for current flow in foil layers. Current is collected in the foil and flows toward the tab. As a result, at position x the current flowing through the foil is the total collected from x to the far end of the cell (shaded region):

$$I(x)=J_L(a-x)a \qquad (1)$$

where JL is the current density and a is the cell width (or length). The resistance dR of the element dx is:

$$dR=(\rho_m/at)dx \qquad (2)$$

where t is thickness of the metal foil, and ρm is the bulk resistivity of the metal. Power loss in the cell is obtained by integrating $dP=I^2(x)dR$ across the length of the cell. When that result is normalized by the total cell area, an area normalized power loss is obtained:

$$P_{norm} = \frac{J_L^2 \rho_m a^2}{3t} \qquad (3)$$

The resistivity of the aluminum foils used in research (>99% Al) were measured, and it was found that it agrees well with the reported bulk resistivity of 2.8×10⁻⁶ ohm-cm. With a 20 µm thick foil for each of the base and emitter connections, and assuming that the foil has 80% of its intrinsic conductivity due to perforations, power loss from equation (3) for a cell producing 40 mA/$cm^2$ is about 0.2 mW/$cm^2$ per foil. Thus at this relatively modest aluminum thickness, a full cell would give up about 0.4% efficiency (absolute) due to resistance in the foil.

An interesting aspect of the foil metallized cell is that an increase in metallization thickness has no meaningful impact on process throughput, since it only involves a change in foil laminate supply. This is in contrast to deposition or plating processes in which metal thickness is normally a function of process time.

Example 3 Bilayer Cells with Emitter Foil Only

In order to demonstrate the process, initial cells were made using a foil/insulator laminate as the emitter connection, followed by laser firing the base contacts and deposition of an evaporated Al base layer (e.g. FIG. 12E).

Cell Process:

Silicon substrates that were ~250 µm thick with a bulk resistivity in the range of 1-3 Ω-cm and a bulk lifetime >2 ms were used. The front surface had a pyramidal texture while the rear had a shiny chemical polish. The front was passivated with ~10 nm of a-Si:H, followed by a SiNx antireflection layer. A rear SHJ was formed by 6 nm of (i)-a-Si:H followed by 7 nm (p)-a-Si:H. The rear structure was then coated with a transparent conducting oxide (TCO) and a thin layer of silver to aid in the foil bonding process.

A foil/insulator laminate (12 μm Al/12 μm PET) was laser patterned to have 500 μm circular perforations on a 1 mm square pitch. A vacuum lamination process bonded the patterned laminate to the substrate, providing conductive contact from the substrate Ag metal to the Al foil. A short etch process selectively removed TCO/Ag from the perforation area to prevent shorting to the base contact.

Due to shorting issues that occur in this test structure when the base metal is applied by vacuum deposition (unlike full foil cells), a secondary insulator is applied and laser patterned. A phosphorus liquid dopant was applied to the substrate followed by laser firing (LF in FIG. 2, 600 ns pulse duration, 532 nm) to produce n+ contacts. The device was completed by evaporation of a 200 nm Al base metal.

All cells were constructed on 25 mm×25 mm substrates, with a cell dimension of 15 mm×19 mm. Light I-V testing was done with a 2.56 cm2 aperture aligned to the cell region. Measurements were done in-house, using an NREL-measured calibration cell as a standard.

Cell Results:

Various optimization studies have been performed on this architecture, mainly examining laser pulse characteristics for their impact on effective lifetime and device performance. This work has also been correlated to studies of laser-fired contact resistance done on a similar test structure. Ultimately, it was concluded that laser firing at shorter wavelength (532 nm vs. 1064 nm) and with longer pulses (600 ns) yielded the best combination of low contact resistance and low laser-induced damage.

The best cell to date with this construction exhibited an efficiency of 18.8%. The $V_{oc}$, $J_{sc}$, and fill factor were 0.644 V, 40.5 mA/cm$^2$, and 72.2%, respectively.

The cells exhibit low shunt current, with reverse dark current at −1 V normally ~10 μA/cm$^2$. This low shunt current in the foil laminate device indicates that our approach of laser firing directly into the SHJ layer without additional isolation is practical.

Example 4

A solar cell employing a multilayer foil assembly was prepared according to the following procedure. A 250 μm thick silicon substrate with light n-type doping was treated by etching processes to have a front textured surface and a rear smooth surface. On the front side, a layer of 10 nm of intrinsic a-Si:H (i-a-Si:H) and a layer of 80 nm of SiN$_x$ were applied by plasma enhanced chemical vapor deposition (PECVD). On the rear side, a layer of 6 nm of i-a-Si:H and a layer of 10 nm of boron doped a-Si:H (B-a-Si:H) were applied by PECVD. The combination of the i-a-Si:H and B-a-Si:H forms a silicon heterojunction (SHJ) emitter. On the rear, an additional metal deposition comprising approximately 100 nm of aluminum doped zinc oxide (AZO) and 300 nm of silver was deposited by sputtering.

A metal foil assembly comprising a first metal foil of 12 μm aluminum bonded to a 12 μm kapton dielectric and further bonded to another 12 μm aluminum foil was patterned by a combination of photolithoghraphy and laser processing to yield a structure like FIG. 2E with ~460 μm circular openings in the first and second metal foils (130, 137) and a 140 μm square opening in the dielectric (138).

The conductive layers on the substrate (AZO, silver) were patterned using photolithography to produce and array of circular openings of approximately 500 μm in diameter (290). A bonding agent comprising poly(vinyl butyral) in methyl isobutyl ketone (MIBK) solvent was applied to the rear of the sample and allowed to dry. The metal foil assembly was placed in contact with the rear of the sample and bonding agent, aligned so that openings in the foil were substantially aligned to openings (290), and subjected to a vacuum lamination process involving heating the assembly to 150° C. for approximately 10 seconds. This process resulted in conductive bonding of the metal foil assembly to the substrate, and more particularly the first metal foil to the substrate. The sample was then treated with tetrahydrofuran for 30 seconds to remove excel bonding agent.

The rear of the sample was etched in a plasma system to remove the i-a-Si:H and B-a-Si:H in the region of the openings produced in the dielectric (138). The rear of the sample was then exposed to an HF containing solution to remove native oxide in those regions, followed by deposition of a TiO$_2$ based carrier selective layer as described in Example 1. Finally, the sample was coated with a uniform unpatterned deposition of 400 nm of Al to connect the base contact to the second metal foil.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A method for forming a solar cell with a carrier selective contact, the method comprising:
   forming a multi-layer foil assembly (MFA), the MFA comprising
   a first metal layer, wherein the first metal layer provides first openings,
   a dielectric layer, wherein the dielectric layer provides second openings aligned with the first openings, and
   a second metal layer, wherein the dielectric layer is sandwiched between the first and second metal layers;
   forming a substrate with a front surface and a back surface, wherein the back surface provides a passivation layer;
   depositing a first carrier selective material onto the back surface of the substrate in a first pattern; and
   applying the MFA to the back surface of the substrate to form carrier selective contacts, wherein the first metal layer contacts the first carrier selective material in the first pattern, and the second metal layer contact the second carrier selective materials in the second pattern.

2. The method of claim 1 further comprising the step of depositing a second carrier selective material onto the back surface of the substrate in a second pattern prior to applying the MFA to the back surface.

3. The method of claim 2, wherein the first pattern corresponds to base regions forming localized carrier selective base contacts, and the second pattern corresponds to emitter regions forming localized carrier selective emitter contacts.

4. The method of claim 2 further comprising the step of locally modifying the passivation layer in regions corresponding to the first pattern, the second pattern, or both prior to depositing the first or second carrier selective materials.

5. The method of claim 2, wherein the deposition of the first or second carrier selective materials is performed using laser transfer.

6. The method of claim 2 further comprising the step of depositing a metal on the first or second carrier selective materials prior to applying the MFA to the back surface.

7. The method of claim 1, wherein the second metal layer is dimpled at locations corresponding to the first and second openings.

8. The method of claim 1, wherein the back surface of the substrate further provides a doped layer on the passivation layer.

9. The method of claim 8 further comprising the step of patterning the doped layer to isolate a base region from emitter regions prior to the application of the MFA to the back surface.

10. The method of claim 8 further comprising the step of depositing a rear conductive structure on the doped layer prior to applying the MFA to the back surface; and
patterning at least a portion of the rear conductive structure prior to applying the MFA to the back surface, wherein third openings in the rear conductive structure are aligned with the first and second openings.

11. The method of claim 1, wherein the first carrier selective material is n-type material.

12. The method of claim 2, wherein the second carrier selective material is p-type material.

13. The method of claim 1, wherein the passivation layer is an insulator or semiconductive material.

14. A method for forming a solar cell with a carrier selective contact, the method comprising:
forming a multi-layer foil assembly (MFA), the MFA comprising
a first metal layer, wherein the first metal layer provides first openings,
a dielectric layer, and
a second metal layer, wherein the dielectric layer is sandwiched between the first and second metal layers, and the second metal layer provides second openings aligned with the first openings;
forming a substrate with a front surface and a back surface, wherein the back surface provides a passivation layer and a doped layer;
applying the MFA to the back surface of the substrate, wherein the first metal layer contacts an emitter, and the dimpled locations of the second dielectric layer contact a base;
processing portions of the dielectric layer corresponding to the first and second openings after applying the MFA to the back surface to define at least one opening through the dielectric layer and the doped layer; and
depositing a carrier selective material in the at least one opening.

15. The method of claim 14 further comprising the step of depositing an upper layer of conductive metal on the carrier selective material and/or the second metal layer.

16. The method of claim 14 further comprising the step of depositing a rear conductive structure on the doped layer prior to the application of the MFA to the back surface.

17. The method of claim 14 further comprising the step of patterning at least the rear conductive structure prior to the application of the MFA to the back surface, wherein third openings in the rear conductive structure are aligned with the first and second openings.

18. The method of claim 14 further comprising the step of dimpling the dielectric layer at locations corresponding to first openings.

19. The method of claim 14, wherein a perforation is provided in the dielectric layer at locations corresponding to the first and second openings.

20. The method of claim 19 further comprising the step of depositing an upper layer of conductive metal on the carrier selective material and the second metal layer.

* * * * *